(12) United States Patent
Reynolds et al.

(10) Patent No.: US 8,972,831 B2
(45) Date of Patent: Mar. 3, 2015

(54) BELIEF PROPAGATION PROCESSOR

(75) Inventors: David Reynolds, Scarborough, ME (US); Benjamin Vigoda, Winchester, MA (US); Alexander Alexeyev, Gorham, ME (US)

(73) Assignee: Analog Devices, Inc., Norwood, MA (US)

( * ) Notice: Subject to any disclaimer, the term of this patent is extended or adjusted under 35 U.S.C. 154(b) by 163 days.

(21) Appl. No.: 13/521,505

(22) PCT Filed: Jan. 11, 2011

(86) PCT No.: PCT/US2011/020794
§ 371 (c)(1),
(2), (4) Date: Jan. 7, 2013

(87) PCT Pub. No.: WO2011/085355
PCT Pub. Date: Jul. 14, 2011

(65) Prior Publication Data
US 2013/0117629 A1    May 9, 2013

Related U.S. Application Data

(63) Continuation-in-part of application No. PCT/US2010/025956, filed on Mar. 2, 2010.

(60) Provisional application No. 61/293,999, filed on Jan. 11, 2011, provisional application No. 61/380,971, filed on Sep. 8, 2010.

(51) Int. Cl.
*H03M 13/00*    (2006.01)
*G06F 11/10*    (2006.01)
(Continued)

(52) U.S. Cl.
CPC .............. *G06F 11/10* (2013.01); *H03M 13/45* (2013.01); *H03M 13/1111* (2013.01);
(Continued)

(58) Field of Classification Search
CPC ............ H03M 13/6597; H03M 13/45; H03M 13/1102; H03M 13/1171; H03M 13/255
USPC .................................. 714/780, 794, 763, 804
See application file for complete search history.

(56) References Cited

U.S. PATENT DOCUMENTS

| | | |
|---|---|---|
| 4,649,515 A | 3/1987 | Thompson |
| 5,243,688 A | 9/1993 | Pechanek |

(Continued)

FOREIGN PATENT DOCUMENTS

| | | |
|---|---|---|
| EP | 0614157 | 10/1999 |
| EP | 1137001 | 9/2001 |

(Continued)

OTHER PUBLICATIONS

Hagenauer, Analog Decoders and Receivers for High Speed Applications, Proc. of 2002 Int. Zurich Sem. on Broadband Comm, 2002.*
(Continued)

*Primary Examiner* — John P Trimmings
(74) *Attorney, Agent, or Firm* — Patent Capital Group

(57) ABSTRACT

A processor includes a first memory module for storing a first set of storage values each representing a respective input, and a second memory module for storing a second set of storage values in analog form. An analog module is coupled to the first and the second memory modules. The analog module is configured to, in each operation cycle of at least one iteration, update at least some of the second set of storage values based on the first and the second sets of storage values. An output module is for generating a set of outputs from at least some of the second set of storage values.

25 Claims, 20 Drawing Sheets

(51) Int. Cl.
*H03M 13/45* (2006.01)
*H03M 13/11* (2006.01)
*H03M 13/25* (2006.01)

(52) U.S. Cl.
CPC ..... *H03M 13/1171* (2013.01); *H03M 13/1102* (2013.01); *H03M 13/6597* (2013.01); *H03M 13/255* (2013.01); *G06F 11/1008* (2013.01)
USPC ............ 714/780; 714/794; 714/763; 714/804

(56) References Cited

U.S. PATENT DOCUMENTS

| | | | |
|---|---|---|---|
| 5,745,382 | A | 4/1998 | Vilim |
| 5,959,871 | A | 9/1999 | Pierzchala |
| 6,185,331 | B1 | 2/2001 | Shi |
| 6,212,654 | B1 | 4/2001 | Lou |
| 6,279,133 | B1 | 8/2001 | Vafai |
| 6,282,559 | B1 | 8/2001 | Helfenstein |
| 6,584,486 | B1 | 6/2003 | Helfenstein |
| 6,633,856 | B2 | 10/2003 | Richardson |
| 6,744,299 | B2 | 6/2004 | Geysen |
| 6,762,624 | B2 | 7/2004 | Lai |
| 6,763,340 | B1 | 7/2004 | Burns |
| 6,771,197 | B1 | 8/2004 | Yedidia |
| 6,938,196 | B2 | 8/2005 | Richardson |
| 6,957,375 | B2 | 10/2005 | Richardson |
| 7,071,846 | B2 | 7/2006 | Moerz |
| 7,203,887 | B2 | 4/2007 | Eroz |
| 7,209,867 | B2 * | 4/2007 | Vigoda et al. ................ 702/189 |
| 7,292,069 | B2 | 11/2007 | Hannah |
| 7,373,585 | B2 | 5/2008 | Yedidia |
| 7,418,468 | B2 * | 8/2008 | Winstead et al. ............ 708/620 |
| 7,669,106 | B1 | 2/2010 | Farjadrad |
| 7,769,798 | B2 * | 8/2010 | Banihashemi et al. ....... 708/801 |
| 7,814,402 | B2 | 10/2010 | Gaudet |
| 8,301,963 | B2 * | 10/2012 | Hou et al. .................... 714/755 |
| 2004/0030414 | A1 | 2/2004 | Koza |
| 2004/0136472 | A1 | 7/2004 | Vigoda et al. |
| 2004/0194007 | A1 | 9/2004 | Hocevar |
| 2005/0165879 | A1 | 7/2005 | Nikitin |
| 2005/0240647 | A1 * | 10/2005 | Banihashemi et al. ....... 708/800 |
| 2006/0026224 | A1 | 2/2006 | Merkli |
| 2007/0245811 | A1 | 10/2007 | Discenzo |
| 2007/0276895 | A9 * | 11/2007 | Winstead et al. ............ 708/490 |
| 2008/0065573 | A1 | 3/2008 | Macready |
| 2008/0077839 | A1 | 3/2008 | Gross |
| 2008/0148128 | A1 | 6/2008 | Sharon et al. |
| 2008/0174460 | A1 * | 7/2008 | Vigoda ........................ 341/118 |
| 2008/0195913 | A1 | 8/2008 | Bates |
| 2008/0256343 | A1 | 10/2008 | Gross |
| 2008/0285688 | A1 | 11/2008 | Arzel |
| 2008/0294970 | A1 | 11/2008 | Gross |
| 2008/0307292 | A1 | 12/2008 | Gaudet |
| 2009/0100313 | A1 | 4/2009 | Gross |
| 2009/0144218 | A1 | 6/2009 | Bonawitz |
| 2009/0187805 | A1 | 7/2009 | Lai et al. |
| 2009/0228238 | A1 | 9/2009 | Mansinghka |
| 2010/0017676 | A1 | 1/2010 | Gross |
| 2010/0033228 | A1 | 2/2010 | Gershenfeld |
| 2010/0281337 | A1 * | 11/2010 | Lo et al. ...................... 714/758 |
| 2010/0301899 | A1 | 12/2010 | Vigoda |
| 2010/0306150 | A1 | 12/2010 | Reynolds |
| 2010/0306164 | A1 | 12/2010 | Reynolds |

FOREIGN PATENT DOCUMENTS

| | | |
|---|---|---|
| EP | 1819054 | 8/2007 |
| WO | WO00/41507 | 7/2000 |
| WO | WO2009/137227 | 3/2010 |
| WO | WO2010/101933 | 9/2010 |
| WO | WO2010/101941 | 9/2010 |
| WO | WO2010/101944 | 9/2010 |
| WO | WO2010/111589 | 9/2010 |

OTHER PUBLICATIONS

Hagenauer, A Circuit-Based Interpretation of Analog MAP Decoding with Binary Trellises, Proc. 3rd ITG Conference Source and Channel Coding, Munchen, 2000.*
Hemati et al., Dynamics and Performance Analysis of Analog Iterative Decoding for Low-Density Parity-Check (LDPC) Codes, IEEE Transactions on Communications, vol. 54 No. 1, Jan. 2006.*
D'Mello, Design Approaches to Field-Programmable Analog Integrated Circuits, Analog Integrated Circuits and Signal Processing, 17(1-2), 1998.
Eguchi, Simple Design of a Discrete-Time Chaos Circuit Realizing a Tent Map, IEICE Trans. Electron. vol. E83-C(5), May 2000.
Gross, Stochastic Implementation of LDPC Decoders, Signals, Systems and Thirty-Ninth Asilomar Conference 2005.
Haley, An Analog LDPC Codec Core, Proc. Int. Symp. on Turbo Codes and Related Topics, 2003.
Kschischang, Factor Graphs and the Sum-Product Algorithm, IEEE Trans. Info. Theory, 47(2), 2001.
LeCun, Loss Functions for Discriminative Training of Energy Based Models, in Proc. of the 10-th International Workshop on Artificial Intelligence and Statistics, 2005.
Loeliger, Decoding in Analog VLSI, IEEE Communications Magazine, pp. 99-101, Apr. 1999.
Loeliger, Probability Propagation and Decoding in Analog VLSI, IEEE Transactions on Information Theory, 2001.
Loeliger, Analog Decoding and Beyond, ITW2001, 2pgs., Sep. 2001.
Loeliger, Some Remarks on Factor Graphs, Brest 2003.
Loeliger, An Introduction to Factor Graphs, IEEE Signal Processing Magazine, pp. 28-41, Jan. 2004.
Luckenbill, Building Bayesian Networks with Analog Subthreshold CMOS Circuits, Yale University, 2002.
Lustenberger, On the Design of Analog VLSI Iterative Decoders, ETH No. 13879, Zurich, 2000.
Mansinghka, Stochastic Digital Circuits for Probabilistic Inference, MIT, Cambridge, Nov. 2008.
Mansinghka, Natively Probabilistic Computation, MIT Ph.D. 2009.
Nguyen, A 0.8V CMOS Analog Decoder for an (8,4,4) Extended Hamming Code, Proceedings of the 2004 International Symposium on Circuits and Systems, 2004.
Rapley, Stochastic Iterative Decoding on Factor Graphs, Proc. 3rd Int. Symp. on Turbo Codes and Related Topics, pp. 507-510, 2003.
Schaefer, Analog Rotating Ring Decoder for an LDPC Convolutional Code, ITW2003, Paris, France, Mar. 31-Apr. 4, 2003.
Sequin, Analogue 16-QAM demodulator, Electronics Letters vol. 40, No. 18, 2004.
Stan, Analog Turbo Decoder Implemented in SiGe BiCMOS Technology, U. of Virginia, Dec. 15, 2002.
Tehrani, Stochastic Decoding of LDPC Codes, IEEE Communications Letters 10(10) Oct. 2006.
Tehrani, Survey of Stochastic Computation on Factor Graphs, ISMVL '07 Proceedings of the 37th International Symposium on Multiple-Valued Logic 2007.
Tehrani, Tracking Forecast Memories in Stochastic Decoders, IEEE ICASSP 2009.
Vigoda, A Nonlinear Dynamic System for Spread Spectrum Code Acquisition, MIT M.S. Thesis, Aug. 1999.
Vigoda, Analog Logic: Continuous-Time Analog Circuit for Statistical Signal Processing, MIT Ph. D. Thesis, Sep. 2003.
Vigoda, Synchronization of Pseudorandom Signals by Forward-Only Message Passing With Application to Electronic Circuits, IEEE Trans. Info. Theory, Aug. 2006.
Wang, Reduced Latency Iterative Decoding of LDPC Codes, MERL TR2005-103, 2005.
Winstead, Analog MAP Decoder for (8,4) Hamming Code in Subthreshold CMOS, ISIT 2001.
Winstead, Analog Iterative Error Control Decoders, U. Alberta, Ph.D. Thesis, 2005.
Winstead, Analog Soft Decoding for Multi-Level Memories, Proc. IEEE Int. Symp. on Multiple-Value Logic (ISMVL'05).
Winstead, Stochastic Iterative Decoders, International Symposium on Information Theory 2005.

* cited by examiner

|  | Clock Cycle | | | |
|---|---|---|---|---|
|  | 0 | 1 | 2 | 3 |
| variable node A inputs | B1 | B0 | B2 | B0 |
|  | C1,1 | C3,0 | C1,2 | C1,0 |
| variable node B inputs | B3 | B1 | B5 | B3 |
|  | C3,3 | C0,1 | C1,5 | C0,3 |
| variable node C inputs | B4 | B2 | B6 | B4 |
|  | C3,4 | C2,2 | C3,6 | C0,4 |
| variable node D inputs | B7 | B5 | B7 | B6 |
|  | C2,7 | C2,5 | C0,7 | C2,6 |
| check node a output | C0,1 | C1,0 | C2,2 | C3,0 |
| check node b output | C0,3 | C1,1 | C2,5 | C3,3 |
| check node c output | C0,4 | C1,2 | C2,6 | C3,4 |
| check node d output | C0,7 | C1,5 | C2,7 | C3,6 |

FIG. 9

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|----|----|----|----|----|----|----|----|----|----|----|----|----|----|
| 0 | 0 |   | 8 |   | 21 |   | 22 |   | 16 |   | 37 |   | 21 |   | 6 |   | 43 | 0 |   |   |   |   |   |   |
| 1 |   | 31 |   | 40 |   | 15 |   | 1 |   | 7 |   | 16 |   | 18 |   | 22 |   | 0 | 0 |   |   |   |   |   |
| 2 | 4 |   | 39 |   | 28 |   | 12 |   | 38 |   | 7 |   | 15 |   | 33 |   |   |   | 0 | 0 |   |   |   |   |
| 3 |   | 12 |   | 14 |   | 37 |   | 12 |   | 40 |   | 2 |   | 25 |   | 16 |   |   |   | 0 | 0 |   |   |   |
| 4 | 10 |   | 13 |   | 6 |   | 13 |   | 30 |   | 11 |   | 22 |   | 28 |   |   |   |   |   | 0 | 0 |   |   |
| 5 |   | 13 |   | 29 |   | 24 |   | 6 |   | 0 |   | 13 |   | 33 |   | 0 |   |   |   |   |   | 0 | 0 |   |
| 6 | 14 |   | 0 |   | 6 |   | 25 |   | 38 |   | 2 |   | 2 |   | 23 |   | 0 |   |   |   |   |   | 0 | 0 |
| 7 |   | 0 |   | 21 |   | 5 |   | 27 |   | 38 |   | 25 |   | 35 |   | 18 | 43 |   |   |   |   |   |   | 0 |

BELIEF PROPAGATION PROCESSOR

CROSS-REFERENCE TO RELATED APPLICATIONS

This application is the National Stage of International Application No. PCT/US2011/020794, filed on Jan. 11, 2011, and is a Continuation-in-Part of PCT Application No. PCT/US10/25956, titled "Belief Propagation Processor," filed Mar. 2, 2010, and published as WO2010/101944 on Sep. 10, 2010, and claims the benefit of the following applications:
   U.S. Provisional Application No. 61/293,999, titled "Belief Propagation Processor," filed Jan. 11, 2010, and
   U.S. Provisional Application No. 61/380,971, titled "Current Mode Analog Logic," filed on Sep. 8, 2010.
Each of the above-referenced applications is incorporated herein by reference.

This application is related to, but does not claim the benefit of the filing dates of, the following applications:
   U.S. patent application Ser. No. 12/716,148, titled "Circuits for Soft Logical Functions," filed Mar. 2, 2010,
   U.S. patent application Ser. No. 12/716,113, titled "Signal Mapping", filed Mar. 2, 2010, and
   U.S. application Ser. No. 12/537,060, titled "Storage Devices with Soft Processing," filed Aug. 6, 2009,
the contents of which are incorporated herein by reference.

BACKGROUND

This document relates to an analog belief propagation processor.

"Belief Propagation" (BP) is an efficient approach to solving statistical inference problems. The approach exploits underlying structure of a network of stochastic elements and its constraints and Bayesian laws of probabilities to find the most optimal set of valid outputs that satisfy constrains and network structure requirements.

Belief Propagation includes a class of techniques for performing statistical inference using a system model that is in the form of a graph. The term "graph" here refers to the mathematical definition of a graph, which represents the connectedness of a set of abstract objects. The objects are often referred to as "nodes" and the connections between objects are often referred to as "edges." One common type of graph used in such models is referred to as a "factor graph." In a factor graph (a particular style of factor graph called a "Forney factor graph") the nodes represents statistical relationships between values, which are represented as edges. Other types of graphs, such as Bayesian networks, and Markov random fields are also commonly used for statistical inference.

Examples of Belief Propagation approaches operate by passing messages between nodes in the graph, where each message represents a summary of the information known by that node through its connections to other nodes. Such approaches are known by various names, including belief propagation, probability propagation, message passing, and summary-product algorithms, among others. Particular forms of these approaches include sum-product, max-product, and min-sum.

A large variety of approaches to coding, signal processing, and artificial intelligence may be viewed as instances of the summary-product approach (or belief/probability propagation approach), which operates by message passing in a graphical model. Specific instances of such approaches include Kalman filtering and smoothing, the forward backward algorithm for hidden Markov models, probability propagation in Bayesian networks, and decoding algorithms for error correcting codes such as the Viterbi algorithm, the BCJR algorithm, and the iterative decoding of turbo codes, low-density parity check codes, and similar codes.

Graphs on which belief propagation may operate include two types: graphs with loops (cyclic graphs) and graphs with no loops (acyclic graphs). Graphs with no loops are also known as "trees." Belief propagation procedures differ fundamentally between these two types of graphs. For a tree, belief propagation approach can proceed in a well-defined order with a well-defined number of steps to compute the result. And assuming ideal computation, this result is always known to be correct. For a graph with loops, on the other hand, belief propagation approaches are generally iterative, meaning the same set of computations must be repeated successively until a result is reached. In this case, the computation typically converges to a useful result, but does not always do so. In some cases, the computation may not converge to a single result, or if it does, the result in some cases is inaccurate. For a cyclic graph, the performance of belief propagation can depend on the order in which the computations are performed, which is known as the message passing 'schedule.'

In one particular application mentioned above, Belief Propagation has been adopted as an efficient method of implementing decoders for various forward error correcting codes. In this case BP uses structure of the code and constraints to infer the correct valid codeword from the input codeword that contains noise, for instance, with each element (e.g., bit) of the input codeword being represented as a distribution rather than a discrete value. In some implementations of Belief Propagation for forward error correction a Digital Signal Processor is used to perform various arithmetic computations required by the algorithm with all the statistical data being processed in digital format.

Observing the fact that "soft"—probabilistic data is continuous in nature, i.e., represented by real values in a finite interval, it is possible to implement belief propagation algorithm using analog electrical circuits. Since only one signal is associated with the unit of statistical data rather than multiple signals for different digits (e.g., binary digits, bits) of the digital signal representing the same data, the savings in hardware and power dissipation can be very significant.

Several architectures had been proposed that utilize analog circuits to perform efficient decoding of various codes, including convolutional codes, Low Density Parity Check Codes (LDPC) or linear block codes. These include analog implementations that use a so-called full flat architecture, where each input data symbol is associated with dedicated computing element.

SUMMARY

In one aspect, in general, an analog processor includes an intermediate value memory, a plurality of analog computation elements, and a controller. The analog processor may be used for error correction of a parity check code having a plurality of parity constraints on input values of an input frame. The intermediate value memory comprising a plurality of memory elements, each memory element being associate with a corresponding constraint and a corresponding input value. Each analog computation modules is used for performing an analog computation associated with a parity constraint of the code. Each input of the computation modules is connectable (e.g, via passive and/or active signal paths) to a selected plurality of the memory elements and each output of the computation modules is connectable to a selected memory element. The controller is used for sequencing operation of the processor in a series of iterations, and in each iteration, in a series of cycles. In each cycle the controller configures connections of inputs and outputs of each analog computation module to perform a computation associated with one of the parity constraints of the code, including connecting each output of the module to a memory element associated with the parity constraint and connecting each input of the module to a memory element associated with an input value used in the parity constraint. In each cycle, no memory element connected to both an input and an output of any of the analog computation modules.

The arrangement of intermediate value memory can permit the controller to sequence connections of the memory elements to the analog computation modules without requiring that any memory element is both read from and written to in one cycle, while also allowing computations for multiple constraints to be performed in each cycle. The arrangement of the memory can be applied to efficiently process LDPC codes.

In another aspect, in general, an analog processor has a first memory module and a second memory module. The first memory module is for storing a first set of storage values in respective storage elements each representing a respective input to the processor. The second memory module is for storing a second set of storage values in analog form in respective storage elements. The second set of storage values includes intermediate values determined during operation of the processor. The analog processor also includes an analog computation module coupled to the first and the second memory modules. This processor is configurable such that in each of a set of operation cycles the analog module determines values for at least some of the second set of storage values based on at least some of the first and the second sets of storage values. An output module is use for generating a set of outputs from at least some of the second set of storage values.

Aspects may include or more of the following features.

The first storage module is configured to store the first set of storage values in analog form.

The analog computation module is linked to the first and the second memory modules via analog signal paths. For example, the analog signal paths are each configured to carry a value on a conductor represented as at least one of a voltage and a current proportional to the value.

The analog module is configurable to determine values for a different subset of the second set of storage values in each of a plurality of operation cycles.

The processor includes input selection circuitry configurable to couple the analog computation module to outputs of selected memory elements of the first and the second memory modules.

The processor further includes, for each analog computation module, a plurality of signal busses, each bus providing an input value to the analog computation module and being switchably coupled to a plurality of the storage elements of the second memory module.

The storage elements are coupled to switchably provide a current representation of a storage value stored in the storage element such that the input value provided to the analog computation module is represented as a current that is substantially proportional to a sum of the currents representations provided by the storage elements.

The processor further include output section circuitry configurable to accept outputs of selected memory elements of the first and the second memory modules, and to determine outputs of the analog processor.

The processor includes multiple analog computation modules being concurrently operable to determines values for different subsets of the second set of storage values in each operation cycle.

The second memory module includes a plurality of section, each associated with a corresponding different one of the analog computation modules for storing values determined by the associated computation module.

The second memory module is configured such that in a single operation cycle, each storage element can provide a storage value to one or more of the analog computation modules and can accept a determined value to storage in the storage element for providing in a subsequent operation cycle.

Each storage element is associated with two storage locations such that in any one cycle, one storage location is used for accepting a determined value and one storage location is used for providing a value.

The second memory module includes multiple memory sections. Groups of the sections form banks, wherein for each of the analog computation modules each of a set of inputs to the module is associated with a different bank of the memory sections.

The processor is configurable such that in each cycle, each memory section includes memory elements that either provide values to one ore more analog computation modules or memory elements that are updated with values from one or more analog computation modules.

The processor is configured to implement a belief propagation computation.

The processor of claim is configured to implement a factor graph computation.

The analog computation module is configured to accept and provide analog signals that are substantially logarithmic representations of at least one of probabilities, likelihoods, and likelihood ratios.

The processor is configured to implement a decoder for a low density parity check (LDPC) code.

The processor further includes a controller configured to control operation of the processor to perform a set of iterations of computation, each iteration comprising a set of computation cycles.

The set of computation cycles is substantially the same in each iteration, each cycle being associated with a configuration of the first and the second storage modules to provide inputs and output to one or more analog computation modules.

The processor is configured and/or configurable to implement a decoder parity check code, and each cycle is associated with one or more parity check constraints, and wherein the cycles of each iteration are together associated with all the parity check constraints of the code.

The analog computation module implements a network of analog processing elements.

The analog processing elements include elements that represent soft logical operations. For example, the soft logical operations include soft XOR operations.

The network of elements is acyclic.

The network of elements includes at least one cycle of elements, the analog computation module being configured to implement an relaxation computation.

The analog computation module includes inputs for configuring one or more gain characteristics in the network of processing elements.

In another aspect, in general, a decoder includes a first memory for storing code data having a length in bits, and a second memory for storing intermediate data in analog form.

The decoder includes an analog decoder core coupled to the first memory and to the second memory. The decoder core has an input length less than the length of the code data and an output length less than a number of constraints represented in the code data. The decoder further includes a controller for, in each of a set of cycles, coupling the inputs of the decoder code to selected values from the first and the second memories, and coupling outputs of the decoder core for storage in the second memory. An output section of the decoder is coupled to the second memory for providing decoded data based on values stored in the second memory.

In another aspect, in general, a method is used for forming a data representation of an analog processor. The method includes forming: a data representation of a first memory module for storing a first set of storage values in respective storage elements each representing a respective input to the processor; a data representation of a second memory module for storing a second set of storage values in analog form in respective storage elements, the second set of storage values including intermediate values determined during operation of the processor; a data representation of an analog computation module coupled to the first and the second memory modules, the processor being configurable such that in each of a set of operation cycles the analog module determines values for at least some of the second set of storage values based on at least some of the first and the second sets of storage values; and a data representation of an output module for generating a set of outputs from at least some of the second set of storage values.

In some examples, forming the data representations includes forming Verilog representations of the processor.

The method can further include fabricating a integrated circuit implementation of the analog processor according to the formed data representation.

In some examples, the method further includes accepting a specification of a parity check code and forming the data representations to represent an implementation of a decoder for the code.

In another aspect, in general, software stored on a computer readable medium includes instructions for and/or data imparting functionality when employed in a computer component of an apparatus for forming an integrated circuit implementation of any of the analog processor described above.

In another aspect, in general, decoding method includes, in each of a series of cycles of a decoding operation, applying a portion of code data and a portion of an intermediate value data to an analog decoder core, and storing an output of the decoder coder in an analog storage for the intermediate data. Data, including intermediate value data from the analog storage, are combined to form decoded data representing an error correction of the code data.

In some examples, each of the series of cycles is associated with a corresponding subset of less that all of a plurality of parity-check constraints of the code. The intermediate value data may include values each associated with a different one of the parity check constraints of the code.

In another aspect, in general, a processor includes a first memory module for storing a first set of storage values each representing a respective input, and a second memory module for storing a second set of storage values in analog form. An analog module is coupled to the first and the second memory modules. The analog module is configured to, in each operation cycle of at least one iteration, update at least some of the second set of storage values based on the first and the second sets of storage values. An output module is for generating a set of outputs from at least some of the second set of storage values.

The analog module may be configured for updating a different subset of the second set of storage values in each of at least two operations cycles of an iteration.

The analog module may include a set of distributed components each configured to update a different subset of the second set of storage values using a different subset of the first set of storage values and the second set of storage values.

In another aspect, in general, a decoder includes a first memory for storing code data having a length in bits, and a second memory for storing intermediate data in analog form. An analog decoder core is coupled to the first memory and to the second memory, the decoder core having an input length less than the length of the code data and an output length less than a number of constraints represented in the code data. A controller in the decoder is for, in each of a plurality of cycles, coupling the inputs of the decoder code to selected values from the first and the second memories, and coupling outputs of the decoder core for storage in the second memory. An output section is coupled to the second memory for providing decoded data based on values stored in the second memory.

In another aspect, in general, a decoding method includes, in each of a number of cycles of a decoding operation, applying a portion of code data and a portion of an intermediate value data to an analog decoder core, and storing an output of the decoder coder in an analog storage for the intermediate data. Data, including intermediate value data from the analog storage, is then combined to form decoded data representing an error correction of the code data.

Advantages of one or more aspects may include the following:

Use of analog computations and/or analog storage of intermediate values provides lower power and/or smaller circuit area implementations as compared to a digital implementations, for instance in applications of iterative decoding or error correcting codes.

Iterative use of one or more analog computation cores provides lower power and/or smaller circuit area as compared to fully parallel relaxation implementations of similar decoding algorithms. In some examples, a partially relaxation implementation in which parts of a computation are implemented in relaxation from in each of a succession of cycles may also provide similar advantages over a fully parallel relation implementation.

Approaches are applicable to decoding of block codes without requiring that the size and/or power requirements of an implementation grow substantially with the length of the code.

Other features and advantages of the invention are apparent from the following description, and from the claims.

DESCRIPTION OF DRAWINGS

FIG. 9 is a table that specifies inputs and outputs for the shared module shown in FIG. 8;

DESCRIPTION

An approach to using an analog processor for belief propagation is described in PCT Publication WO2010/101944 and is included below. The description below first provides in Section 1 a description of a general approach to analog belief propagation, and provides in Section 2 a description of one or more additional embodiments, which include improvements to the general approach, for instance, based on arrangements and/or scheduling of memory access, and use of current-mode analog storage elements. Section 3 provides further details of further embodiments, implementations and/or applications of the approach.

1 Overview of Analog Belief Propagation

Figure 1:
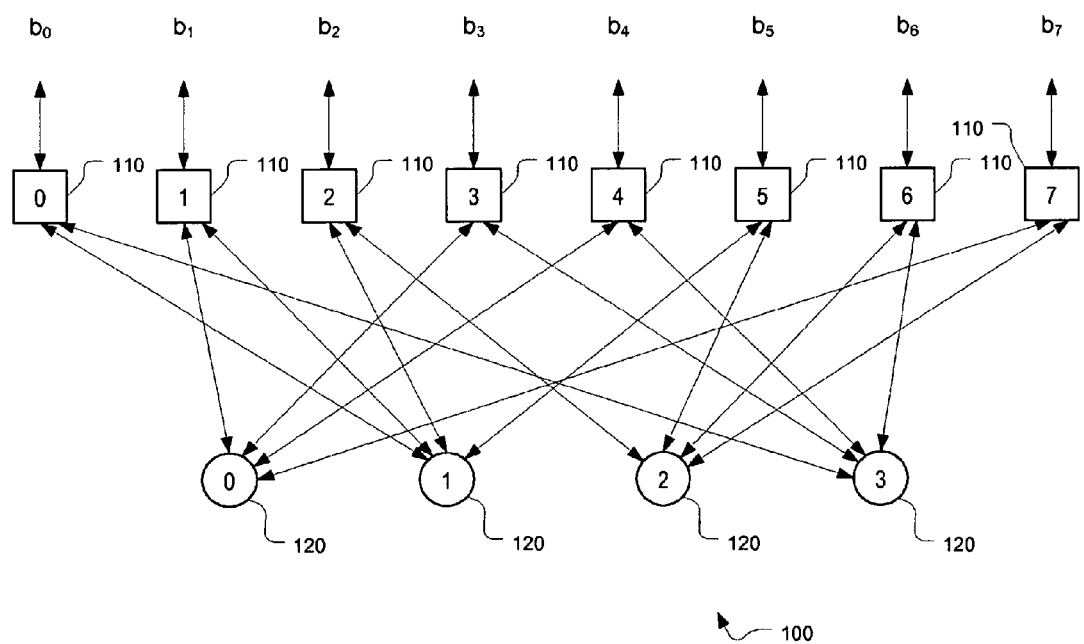
FIG. 1 is an example factor graph for a length 8 LDPC code.

Referring to FIG. 1, in one example of an analog-based implementation of a belief propagation processor, a decoder for a Low Density Parity Check (LDPC) code is based on a factor graph 100 in which one variable node 110 is associated with each different input bit ($b_j$), and one check (constraint) node 120 is associated with each constraint. In FIG. 1, an example with eight input bits in an input frame with four checks (constraints) on the input bits is shown. The code can be represented in matrix form in which each column is associated with a different input bit, and each row is associated with a different check or constraint. An (i, j) entry is 1 if the $j^{th}$ input is used in the $i^{th}$ constraint and 0 otherwise. In the LDPC example, the constraint is that the XOR of the inputs for a constraint is 0. This example length 8 LPDC code can be represented according to the following check matrix (note that the rows are dependent modulo 2 in this illustrative example, which is not necessarily true in general):

$$\begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix}$$

Figure 2A:
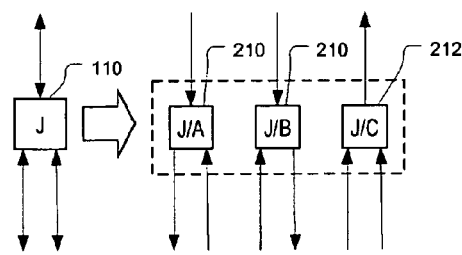
FIG. 2A is a diagram that illustrates transformation of a variable node with bidirectional links to a set of variable nodes with directed links.
Figure 2B:
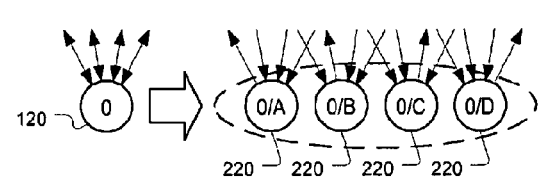
FIG. 2B is a diagram that illustrates a similar transformation for a constraint node.

In FIG. 1, each edge is bidirectional. Referring to FIGS. 2A-B, an equivalent directed (unidirectional) graph can be formed by replacing each n-edge node with n separate nodes, each of the n nodes having n−1 inputs and one output, and forming unidirectional edges between the nodes to achieve the connectivity of the original graph. Referring to FIG. 2A, for instance, each 3-edge variable node 110 can be replaced with three 2-input/1-output variable nodes 210, 212. Referring to FIG. 2B, each 4-edge check node 120 can be replaced with four 3-input/1-output check nodes 220.

Figure 3:
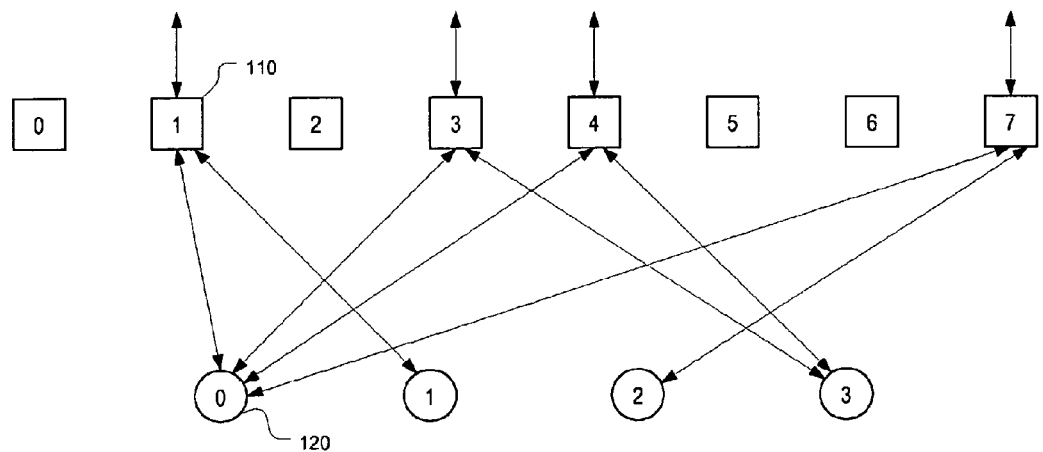
FIG. 3 is a portion of the graph shown in FIG. 1.
Figure 4:
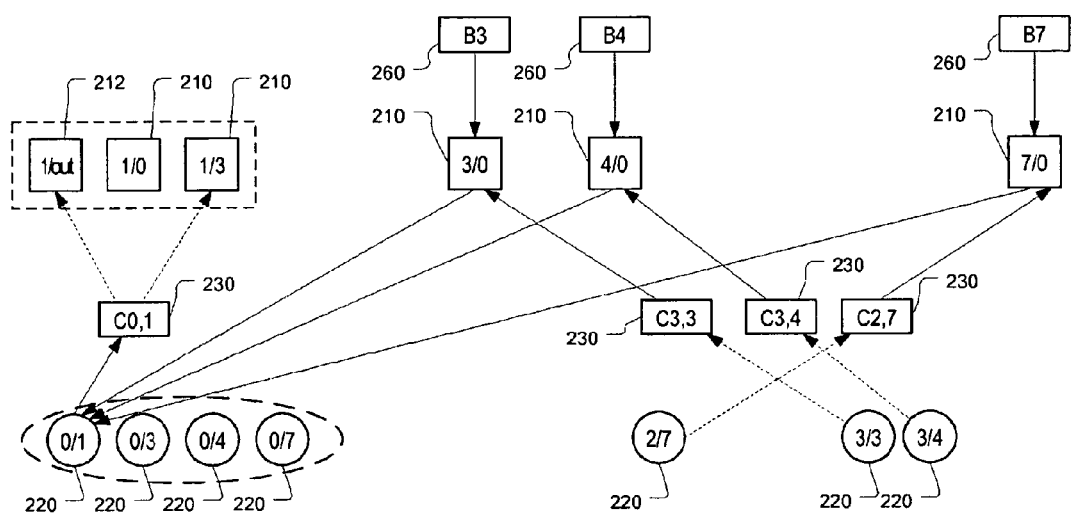
FIG. 4 is a portion of a directed graph corresponding to the portion of the bidirectional graph shown in FIG. 3.

One approach to analog implementation of a decoder corresponding to the factor graph shown in FIG. 1 is to implement a circuit element for each node of the equivalent unidirectional graph. Referring to FIG. 3, a portion of the graph shown in FIG. 1 is illustrated showing check node 0 (120), the bidirectional edges and variable nodes 1, 3, 4 and 7 (110) linked to that check node, as well as the other check nodes 1, 2 and 3 (120) linked to those variable nodes. Referring to FIG. 4, a portion of the corresponding directed graph is shown in which check node 0 (120) is expanded as four 3-input/1-output check nodes 220, for instance, labeled "0/1" to indicate that this is part of the expansion of check node 0 with the output link coupled to variable node 1. Similarly variable node 1 (110) is shown in its expansion into three 2-input/1-output nodes 210, 212, for instance, labeled "1/0" to indicate that this is part of the expansion of variable node 1 with the output link coupled to check node 0, or labeled "1/out" to indicate that the output link provides an output of the factor graph.

In the example, which is partially illustrated in FIG. 4, a full implementation has four circuit elements for each check node (i.e., 16 total expanded unidirectional check nodes 220), and three circuit elements for each variable node (i.e., 24 total expanded unidirectional variable nodes 210, 212). Out of the three circuit elements for a variable node, two (i.e., 16 total expanded variable nodes 210 for all variable nodes) are used for message passing in an iterative stage of decoding operation, and one (i.e., 8 total expanded variable nodes 212 for all variable nodes) is used for generating the decoder output (i.e., the "belief") in an output stage of decoding operation, as will be described further below.

In operation, input signals $y_i$ are used to determine corresponding analog representations of input messages, which may be determined in a signal mapping circuit. In some examples, the inputs messages form representations of the probabilities corresponding to bits $b_i$, but the reader should recognize that the discussion below with respect to computations involving representations of bit probabilities is illustrative of a particular form of input and internal messages that are stored or passed during computation. These messages are provided to the inputs of the variable nodes 210, for example, as outputs of analog input registers 260. As discussed further below, in some embodiments the representations of the bit probabilities are provided as analog signals from the input registers 260 encoding a (prior) log likelihood ratio (LLR) which is typically of the form $$\log\left(\frac{Pr(b_i = 0 \mid y_i)}{Pr(b_i = 1 \mid y_i)}\right),$$

In the case of equal prior bit probabilities $P(b_i=0)=P(b_i=1)$ is equal to $$\log\left(\frac{P(y_i \mid b_i = 0)}{P(y_i \mid b_i = 1)}\right).$$

In some examples, these bit probabilities are encoded as voltage or current in single-ended or differential form (e.g., using a pair of conducting paths for each unidirectional signal).

The approach partially illustrated in FIG. 4 is one of a number of approaches to implementation of a decoder corresponding to the graph shown in FIG. 1 that involve introducing an analog memory element 230 to break some or all cycles in the directed graph. In the approach shown in FIG. 4, the memory elements are introduced at the outputs of the check nodes. Other versions have such memory elements introduced at the output of the variable nodes instead of or in addition to the memory elements at the outputs of the check nodes. Note that in yet other embodiments, some or all cycles remain without memory elements, and operation is at least partially based on a "relaxation" form of computation as signals propagate through the cycles. In some embodiments, as combination of relaxation and memory based computation is used.

As illustrated in the example partially illustrated in FIG. 4, memory elements 230 in this embodiment store values in analog form, and are introduced at each output of the check nodes 220; that is, 16 memory elements are introduced. For notational simplicity, these locations are indexed as (i, j) and labeled "Ci,j", for the output from check node i that is linked to variable node j. Note that each location corresponds to one of the non-zero entries in the check matrix of the code. The (i, j) memory location corresponds to the row i, column j, non-zero entry of the check matrix of the code.

In a number of approaches that make use of analog memory elements, the memory is introduced in the circuit implementation of the graph such there remain no cycles in the directed graph by breaking all cycles in the directed graph. The circuit implementation is then operated in a series of clocked cycles, such that at each cycle analog values read from some or all of the analog memory elements are propagated through analog circuit elements to inputs of some or all of the memory elements where they are stored at the end of the clock cycle. As discussed in detail below, such clocked ("discrete time") implementation can be used to decode with a result that is similar to that which would result from a relaxation ("continuous time") implementation.

Figure 5:
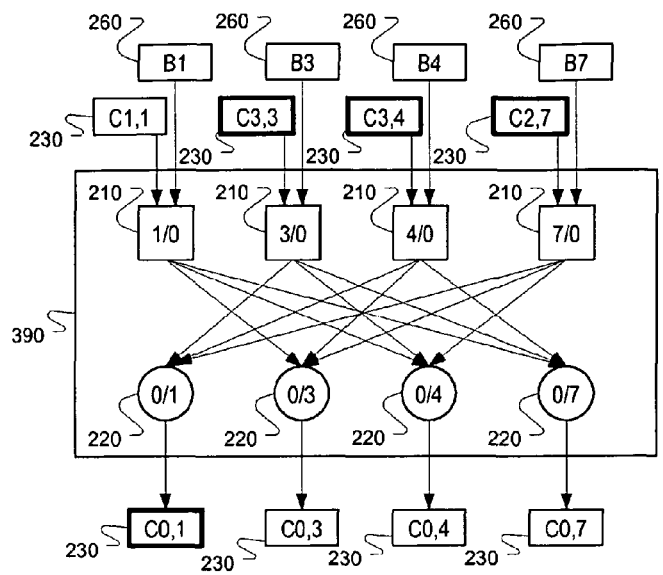
FIG. 5 is a diagram illustrating a module implementation corresponding to the portion of the graph shown in FIG. 4.
Figure 7A:
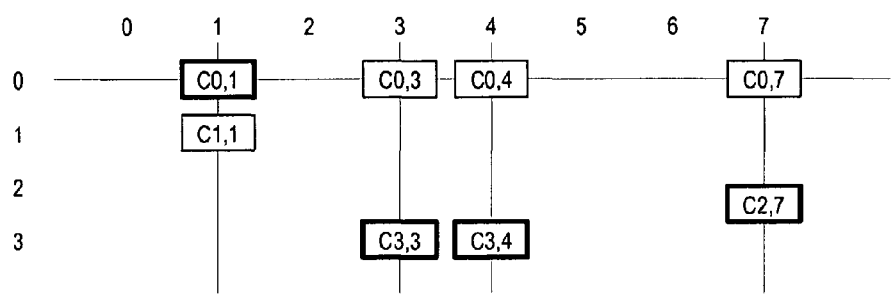
FIG. 7A is a diagram that shows a relationship between input and outputs or a module.
Figure 7B:
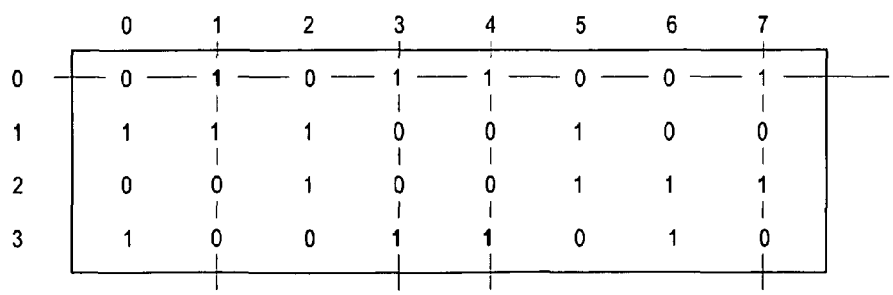
FIG. 7B illustrates the corresponding code matrix.

Referring to FIG. 5, another partial illustration of the example shown in FIG. 4 includes outputs of the four expanded check nodes 220 associated with the original check node 0 (120). A circuit block 390 forms an analog computation module that includes implementations of the expanded variable nodes 1/0, 3/0, 4/0, and 7/0 (210) which have outputs to the four expanded check nodes 220. Note that check node 0 corresponds to row 0 of the matrix representation of the code, which is reproduced in FIG. 7B. Note that the outputs of the circuit block 390 correspond to the memory locations row 0 of the matrix representation, as illustrated in FIG. 7A. The inputs of the circuit block 390 correspond to the non-zero entries in each column of the matrix representation that has a non-zero entry in row 0, omitting those entries in row 0. In this illustration, the inputs correspond to the non-zero entries in columns 1, 3, 4 and 7 in rows 1, 2 and 3. This results in four memory cell inputs, C1,1, C3,3, C3,4 and C2,7, in addition to the inputs from the input bit probabilities, B1, B3, B4, and B7.

An example of a full clocked circuit implementation of a decoder for the length 8 LDPC has a memory element 230 at the output of each unidirectional check node 220, and four copies of the circuit block 390, one corresponding to each row of the code matrix. In the first stage of decoding operation, each unidirectional variable node 210 (i.e., a total of 16 circuit elements) takes its input from an output of a memory element 230, and one of the input bit probabilities 260. (Note that in general for other size codes, the variable nodes are associated with more than two check nodes, and therefore variable nodes would take as input values from multiple memory elements). The memory cells 230 as a whole form a memory that is configured so that effectively all the values are updated at once at the end of each clock cycle. One implementation of such a memory uses a "double buffering" approach in which two banks of memory are used, and in each clock period, one bank is read from and the other bank is written to, with the banks switching role between each clock period.

In some examples, the decoder may perform memory updates in successive clock cycles, each clock cycle corresponding to a full update of all memory cells of the memory 250. The number of clock cycles to be performed in the first stage of decoding operation may be pre-determined, for example, based on design preference, or depend upon the satisfaction of certain convergence conditions, for example, satisfaction of the code constraints (i.e., full error correction) or a condition based on a rate of change of output values between iterations.

Figure 6:
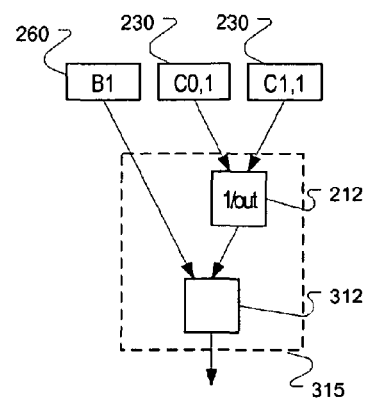
FIG. 6 is a diagram illustrating output calculation.

Referring to FIG. 6, in some examples, once the iterations of memory updates are completed, the decoder proceeds to the output stage of decoding operation to generate decoder outputs representing bit estimates. Here, the decoder outputs are denoted as $\hat{b}_j$, each being an estimate of a corresponding input bit ($b_j$) based on the entire input signal. In some examples, as illustrated in FIG. 6, the variable node 212 outputs a message that includes a representation of the bit probability after decoding, for example, as an LLR, which can be considered to approximate $$\log\left(\frac{P(b_i = 0 \mid y_{\setminus i})}{P(b_i = 1 \mid y_{\setminus i})}\right)$$

where $y_{\setminus i}$ denotes the observations not including $y_i$. The output of variable node 212 is combined in a combination element 312 with the input bit probability representation from input register 260 to form the representation of the bit probability based on all the inputs and the constraints between the decoded bits. Recall that the output of input register 260 can be considered to represent $$\log\left(\frac{Pr(b_i = 0 \mid y_i)}{Pr(b_i = 1 \mid y_i)}\right)$$

and therefore the combined probability output from combination element 312 is computed as a sum approximates $$\log\left(\frac{Pr(b_i = 0 \mid y)}{Pr(b_i = 1 \mid y)}\right)$$

where y represents all the input values. Optionally the combined bit probability is passed through a hard decision, which in the case of binary outputs and logarithmic representations determines $\hat{b}_j$ to take on the value of either 0 or 1 based on a thresholding of the combined log likelihood ratio as either greater or less than zero. For example, the output element that uses memory elements C0,1 and C1,1 and the input B1 to generate bit estimate $\hat{b}_j$. In some implementations, the set of eight output elements may be configured to operate in a parallel fashion to generate the full set of bit estimates $\hat{b}_j$ in a single clock cycle. Note that as illustrated in FIG. 6, elements 212 and 312 are drawn as separate. However, each effectively computes a sum of its inputs, and the two summations may be combined into a single circuit element 315.

Figure 8:
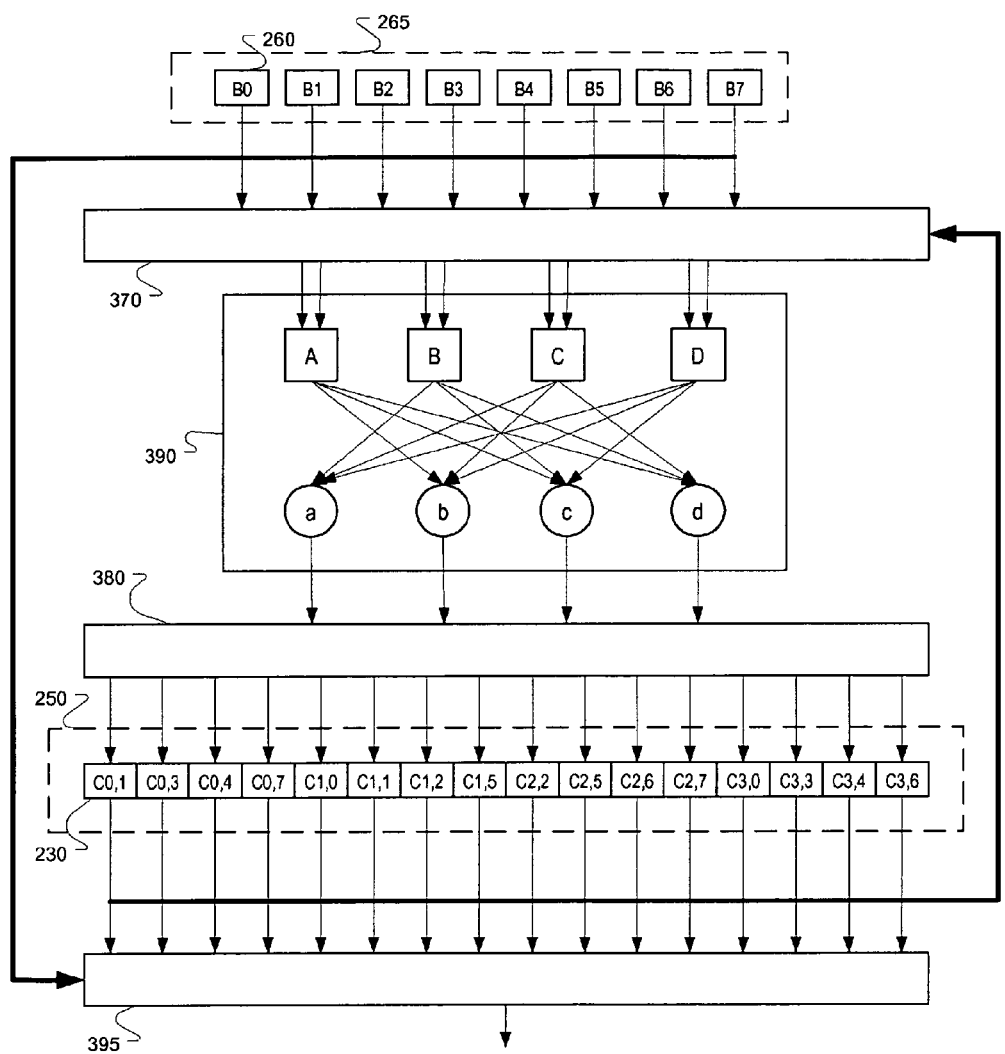
FIG. 8 is a diagram of an implementation of a decoder for a length 8 LDPC code using a shared module.

Referring to FIG. 8, in another example of a clocked circuit implementation each of the nodes of the directed graph is not required to correspond to a different circuit element. That is, certain circuit elements form analog computation modules ("cores") that are reused multiple times with different input and output connections (i.e., shared) within each iteration. The functions performed by multiple modules 390 in one clock cycle in the previous example are carried out in a series of clock cycles such that at in each of the series of clock cycles, only some of the memory elements 230 are updated, with all the memory elements being updated at the end of the series of clock cycles. Similarly, in the output stage of decoding operation, one or more shared circuit elements (e.g., element 315) may be reused in an output section 395 for generating one or more bit estimates in each of a series of clock cycles. In the discussion below, the entire series of clock cycles that updates all the memory elements in FIG. 3 is referred to as an "iteration."

Continuing to refer to FIG. 8, a shared module 390 is coupled to input selection circuitry 370 and output circuitry 380, which together provide interfaces to the memory elements 230 in the memory 250. For example, the input circuitry 370 couples each input of a variable node 210 to the output of an appropriate memory cell 230 and to an appropriate input register 260, which collectively form an input memory module 265, and the output circuitry 380 passes the outputs of the check nodes 220 to the inputs of appropriate memory cells 230, which collectively form an intermediate memory module 250. In this example, the shared module 390 includes all the variable nodes 210 and check nodes 220 needed to compute all the outputs corresponding to one of the bidirectional check nodes 120 in the factor graph illustrated in FIG. 1. During each successive clock cycle of an iteration, the input circuitry 370 and the output circuitry 380 is effectively reconfigured to change the connection of the variable nodes 210 and check nodes 220 to the memory 250 and the input bits.

As an example of a multiple cycle iteration using the shared module 390 illustrated in FIG. 8, the table shown in FIG. 9 illustrates the configurations during the four clock cycles of an iteration. Note that the configuration indicated for cycle 0 corresponds to the configuration illustrated in FIG. 5.

In some examples, multiple shared modules 390 are implemented in a single integrated circuit. For example, the example shown in FIG. 8 may be modified to have two shared modules, thereby providing eight new values for memory cells 230 in each clock cycle, with the iteration to update all the memory cells taking a total of two cycles (i.e., four constraints per iteration divided by two constraints per cycle yielding two cycles per iteration). Similarly, in some examples, a shared module may update fewer cells, for example, updating only a single cell in each clock cycle (i.e., using a single check node 220 and three variable nodes 210).

In the example illustrated above in FIG. 8, the updated values to the memory 250 are not passed through to the outputs of the memory until after the entire iteration is completed. In some examples, the updated values determined in one clock cycle may be presented at the output of the memory during subsequence clock cycles within the same iteration. In such examples, the order in which the outputs of the check nodes are computed (the "schedule") may be significant. Examples of schedules include a sequential updating of the outputs associated with each of the check nodes 120 (see the factor graph in FIG. 1), and random updating in which different nodes are updated at each clock cycle.

Figure 10:
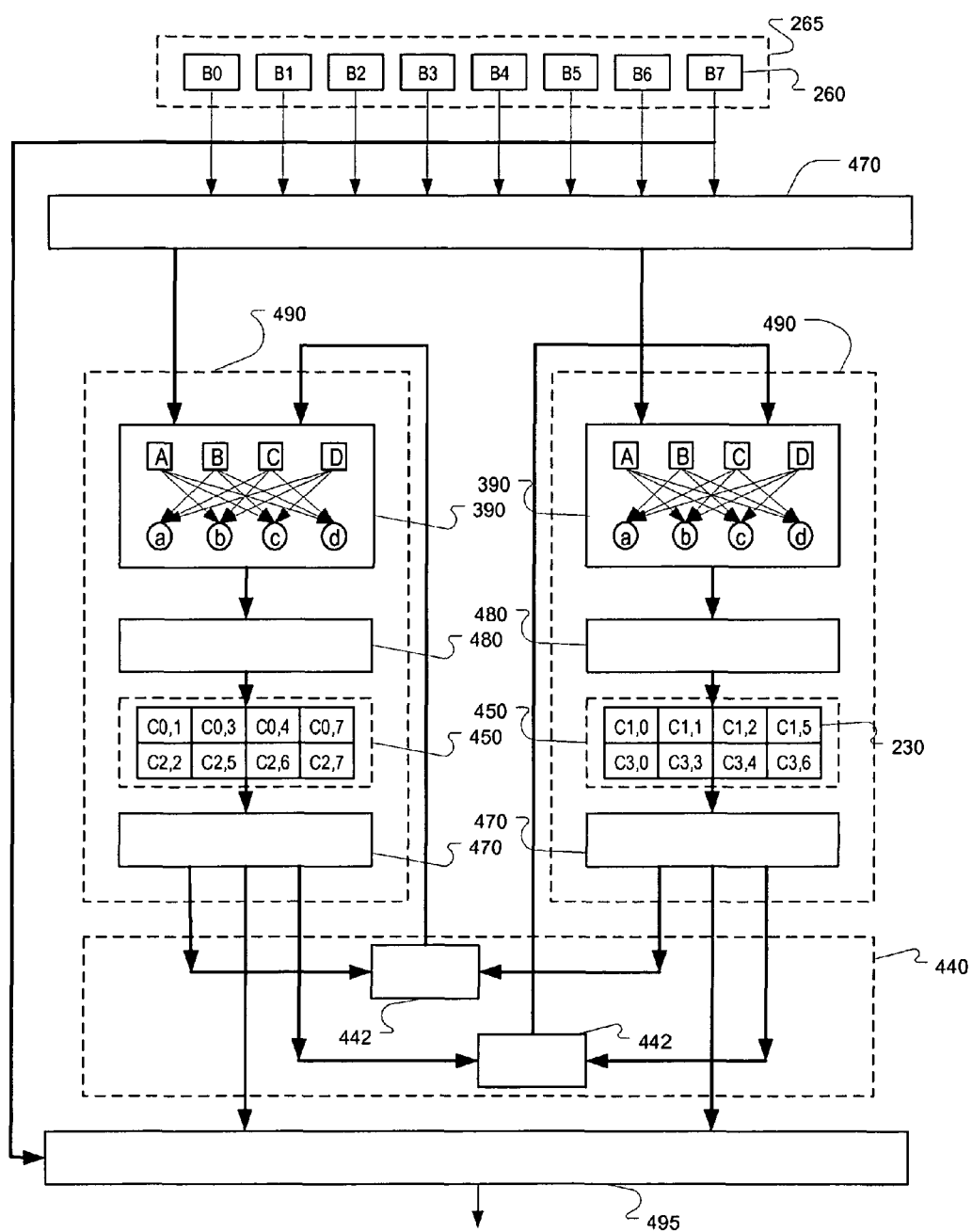
FIG. 10 is a block diagram of a decoder with two shared modules.

Referring to FIG. 10, in some examples, multiple modules 390 are used (but not a sufficient number so that an iteration may be completed in a single cycle), and the input selection circuitry 370, output selection circuitry 380, and memory 250, are distributed among a set of local processing elements 490, and each local processing element 490 has one shared module 390. Each local processing element has a local output circuitry 480 and a local input selection circuitry 470. The memory is distributed such that the memory cells 230 in the memory 450 of a local processing element are those cells that are updated by the shared module 390 in the various clock cycles of an iteration. As illustrated, each row of memory cells is updated in one clock cycle. A control input controls the configuration of the input and output circuitry according to the cycle in the iteration being performed. Note that in general, a shared module 390 at one local processing element 490 requires outputs of memory cells 230 in a local memory 470 of its own local processing element and/or another (or more generally, one or more other) local processing element. The local input selection circuitry 470 selects the memory cells required by each of the local processing elements and passes those values onto a global selection unit 440, which then determines the proper subsets of the memory values to be passed onto each one of those local processing elements. In the output stage, the memory cells are coupled through the selection circuitry 470 to the output section 495 to determine the outputs. The configuration shown in FIG. 10 can also be understood as the function of input selection logic 370 shown in FIG. 8 is distributed among blocks 470 and 442, and the output logic 380 is distributed among the blocks 480.

In some examples, the global selection unit 440 may include a set of selection units 442, each coupled to inputs of a respective local processing element to provide the corresponding subset of memory values to the shared module 390. For example, one selection unit 442 may receive 8 signals representing memory values provided by the two local input selection circuitries 470 to generate four output signals representing the memory values to be provided to the local processing element shown on the left of FIG. 10.

Referring again to FIG. 8, in some examples, the memory 250 as a whole is configured such that effectively all the values are updated exactly once in an iteration. In one implementation of such a memory using a "double buffering" approach two banks of memory are used. In iteration k, the write circuitry always writes into memory bank #1, and the read circuitry always reads from memory bank #2. By the end of iteration k, memory bank #1 has achieved a full update. In the next iteration k+1, the write circuitry switches to write into memory bank #2, and the read circuitry reads from memory bank #1 which was just updated in the last iteration.

In this case, the memory 250 would need a capacity twice the amount of the outputs from the local check nodes to keep two different copies for read and write operations respectively.

Figures 11, 12:
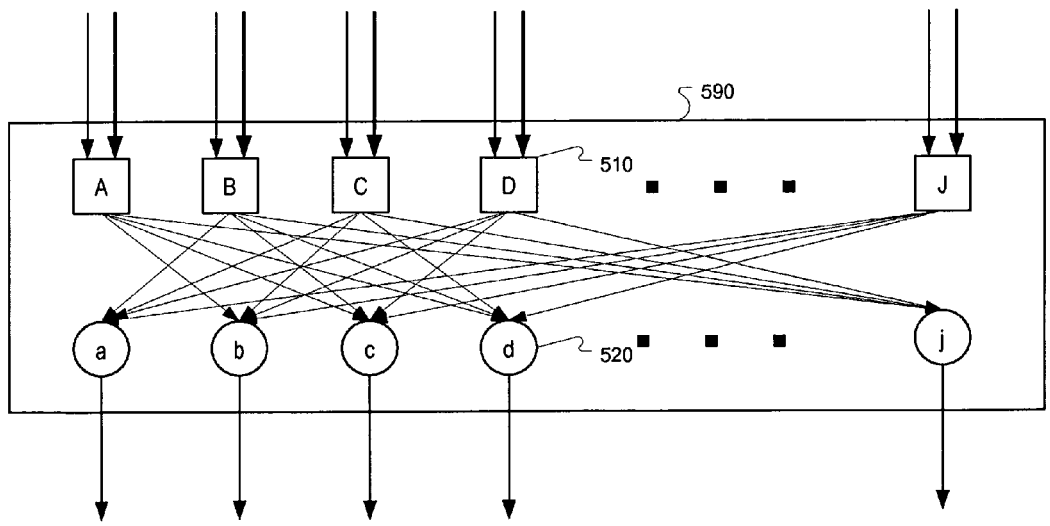
FIG. 11 is a tabular representation of a parity matrix for a (1056, 352) LDPC code.
FIG. 12 is a diagram of a shared module for use with the code shown in FIG. 11

The approaches described above in the context of a length 8 code is applicable to a larger example of an (1056,352) LDPC code, such as is used in IEEE 802.16 based communication. The check matrix of the code can be represented in tabular form breaking the 0,1 matrix into 8 rows by 24 columns of 44 by 44 blocks, with each block being either all zero, or being a shifted (circularly offset) diagonal with one non-zero entry in each row and in each column. This tabular representation of the code is shown in FIG. 11. The upper-left (0,0) block (showing the number of "0") in the tabular representation is a diagonal matrix. The (0,2) block shown as a "8" is a off-diagonal block $M=[m_{i,j}]$ such that $m_{i,j}=1$ if $j=i+8 \pmod{44}$ and 0 otherwise. The full factor graph is not illustrated, but can be derived from the matrix representation in the same manner as the example illustrated in FIG. 1.

Referring to FIG. 12, a module 590 is configured to include variable nodes 510 and constraint nodes 520 for the code shown in FIG. 11. Note that the nodes illustrated in FIG. 12 are unidirectional nodes in which links are either input or output links. Module 590 is analogous to module 390 for the length 8 code discussed above. Note that each row in the code matrix shown in FIG. 11 has ten non-zero entries in all row blocks, except row block 6, which has eleven non-zero entries per block. In order to implement constraints outside row block 6, the module 590 has ten (unidirectional) variable nodes 510 and ten (unidirectional) constraint nodes 520, and for rows in row block 6, eleven (unidirectional) variable nodes 510 and eleven (unidirectional) constrain nodes 520. Each variable nodes accepts inputs for memory cells corresponding to non-zero entries in a particular column of the code matrix. Therefore, variable nodes corresponding to columns in the range 0 through 15 have four inputs (three inputs for memory cells corresponding to entries in the code matrix and one input for the bit probability) and one output. Variable nodes for columns 16 through 23 have two or three inputs depending on the column and the block row. In some examples, the module 590 has the maximum number of variable nodes and inputs necessary, and is configurable during different cycles to accommodate the specific number of variable nodes and inputs needed, for instance, by ignoring certain inputs.

Figure 13:
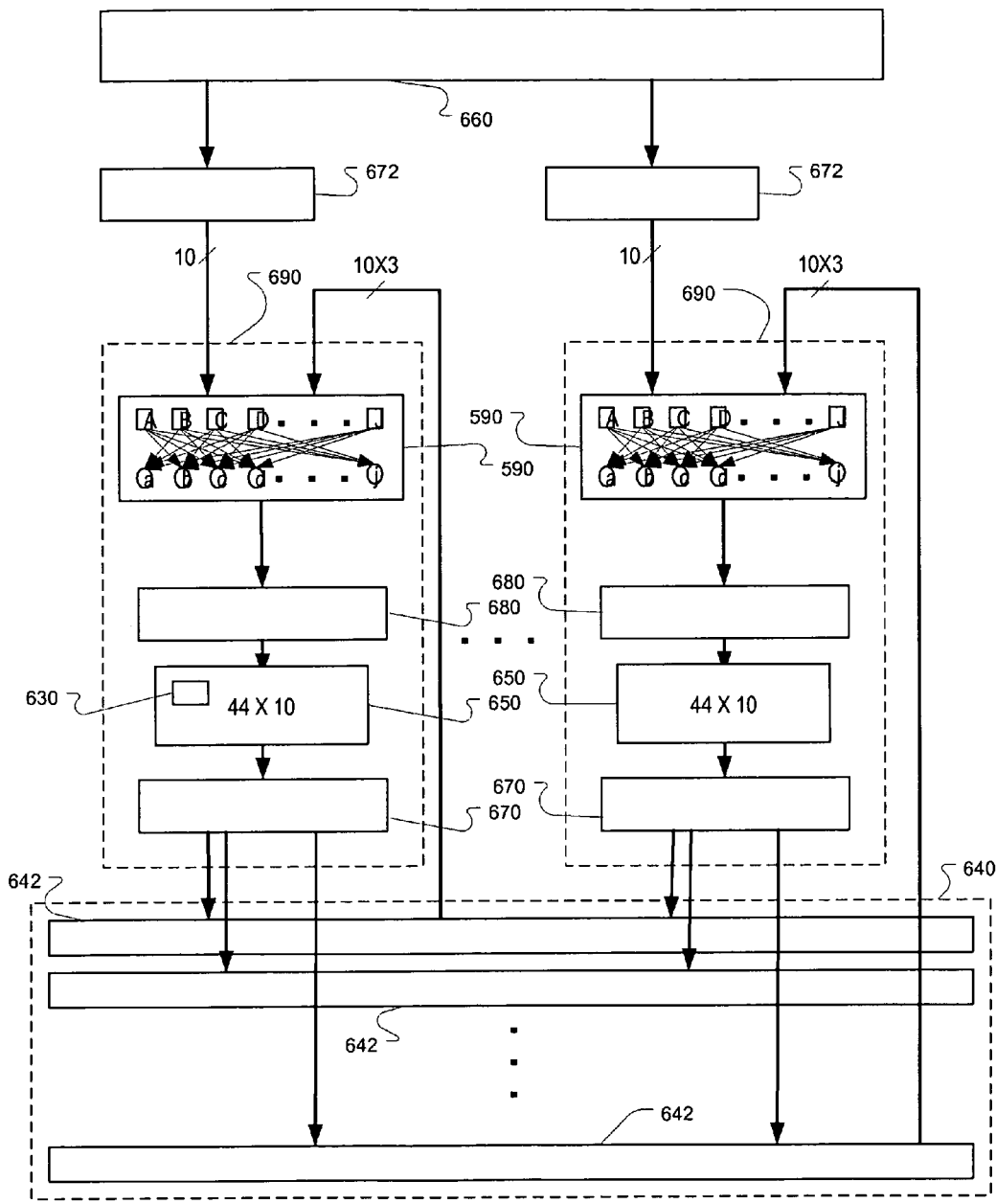
FIG. 13 is a block diagram of a decoder for a (1056, 352) LDPC code with eight shared modules (of which two are illustrated)

FIG. 13 illustrates one type of implementation of a decoder operable to perform the iterative stage of decoding operation for use with the (1056, 352) LDPC code shown in FIG. 11. In such an implementation, the decoder includes an analog input memory 660 that stores representations of the input bit probabilities (e.g., as voltages encoding log likelihood ratios) corresponding to the 1056 bits (i.e., 24 blocks of 44) of the LDPC code illustrated in FIG. 11. These input bits are then distributed by memory selection circuitry 672 to be processed in a set of local processing elements 690. Each local processing element 690 has a shared module 590 that includes the variable nodes and check nodes needed to compute all the outputs corresponding to one of the check nodes of the full factor graph. The structure of each processing element 690 is similar to each processing element 490 shown in FIG. 10 to implement the decoder for a length 8 code.

Each local processing element 690 also includes a local output circuitry 680, which directs the output of the local check nodes into appropriate cells 630 of a memory 650. In this example, the memory is distributed among the set of local processing elements 690 as a set of local memories 650, each of which includes memory cells 630 updated by the shared module 590 of its local processing element 690 (not other local processing elements) in the various clock cycles of an iteration. As described before, in general, each shared module 590 at one local processing element 690 requires outputs of memory cells in a local memory 650 of its own local processing element and/or one or more of other local processing elements. These outputs are obtained by a set of local read circuitry 670 that retrieve values from the local memory 650 and send them to a global selection unit 640, which then determines the appropriate combinations of output values to be sent to the individual local processing elements 690 at various clock cycles. The global selection unit 640 includes a separate input selection unit 642 associated with each of the local processing elements, and provides as outputs the values stored in the memories 650 required for input that that unit on each iteration.

Implementations of the type illustrated in FIG. 13 can have different numbers of processing elements, and use different schedules of applying each of the 352 constraints in different cycles of a decoding iteration. Referring back to FIG. 11 in the matrix representation of the (1056, 352) LDPC, out of the total 8 blocks of rows, rows in 7 of the blocks of rows (i.e., row blocks, 0-5, and 7) contains 10 non-zero entries, and row in one block (row block 6) each contains 11 non-zero entries. Therefore, of the 192 (i.e., 24*8) blocks of entries, only 81 are non-zero, and each of the non-zero blocks has exactly 44 non-zero entries, for a total of 3564 (81 times 44) entries.

The exemplary arrangement shown in FIG. 13 uses a set of 8 local processing elements 690 each configurable to perform the computation associated with one check node (i.e., one row), of a corresponding block of rows of the check matrix. In other words, each local processing element 690 is used repeatedly in 44 cycles to compute the outputs for the 44 constraints represented by the 44 rows of the code matrix in the corresponding block. For example, the 8 elements apply constraints 0, 44, 88, . . . , 308, respectively, on the first cycle, constraints 1, 45, 89, . . . , 309, respectively, and finally 43, 87, 131, . . . , 351, respectively, on the last cycle of an iteration.

Note that because of differences in each of the row blocks in the code matrix, the shared module 590 in each local processing element 690 may be have differences. Consider a shared module 590 for performing the computation associated with a row in the first (row block 0) block. The corresponding check node in the bidirectional graph has 10 edges linked to variable nodes. Each of the first 8 variable nodes has five edges, four to check nodes and one to a bit input; the $9^{th}$ variable node has four edges, three to check nodes and one to a bit input, and the $10^{th}$ variable node has three edges, two to check nodes and one to a bit input. The shared module 590 therefore has circuits for 10 (directional) check nodes, each with 9 inputs and one output. The 10 outputs of the check nodes update 10 locations in the local memory. The local processor has circuits for 10 (directional) variable nodes 510, each with four, three, or two inputs and one output. Each node 510 provided an input to 9 of the 10 (directional) check nodes 520. Of the inputs for each variable, one input is for an input bit probability and the remainder are for values from the local memories.

Shared modules 590 in the other local processing elements have the same structure as that associated with row block 0, with differences including the shared module 590 for row block 6 having 11 check nodes, and 11 variable nodes, and the share module 590 for blocks 1 through 5 each having two variable nodes with two inputs and the other variable nodes having four inputs.

In operation, at each clock cycle, the variable nodes of shared module 590 for row block 0 reads 10 sets of inputs from the input memory 660, one set for each variable node and updates 10 locations of the local memory 650. The values from memory 650 are passed through the blocks 670 of multiple of the local processing elements 690 and through the control unit 642 associated with the destination processing element. Over 44 clock cycles of an iteration, the shared module 590 provides updated values for all 440 (44 times 10) locations in the local memory.

As outlined above, in some embodiments, each one of the shared modules 590 may be implemented as a combination of 10 variable nodes and 10 check nodes (also referred to as a 10×10 shared module), except for the shared module 590 for row block 6 which is implemented as a 11×11 module.

A number of different circuit arrangements and signal encodings can be used within the approaches described above. For certain soft decoding applications, each variable node circuit can be formed using a soft Equals gate, and each check node circuit can be formed by a soft XOR gate. In the example of FIG. 13, each variable node takes the form of a 4-input (or 3-input or 2-input) soft Equals gate and each check node takes the form of a 9-input (or 10-input) soft XOR gate. Therefore, for each shared module 590, besides reading the 10 (or 11) of input bits (one each soft Equals gate) from the input memory 660, it also requires 10 (or 11) sets of values from the local memories 650 (one set for each soft Equals gate). Note that in this example these values come from the memory cells in the other local processing element(s), and not from the memory 650 in the same processing element.

One approach for providing the proper combinations of memory values needed as input to the shared modules 590 includes forming, in the global control unit 640, a set of 8 individual selection units 642, each of which selects or combines the outputs of the local processing elements 690 as needed for the input values for a corresponding shared module 590. In some examples, each one of the read circuitry 670 is selectively coupled to the set of 8 selection units, for example, using a set of 8 buses with each bus containing 10 (or 11) wires for sending a total of 10 (or 11) output values to an individual selection unit in one clock cycle. The selection unit 642 then chooses a set of 10×3 (or 11×3) output values for input to the shared module 690.

By arranging the decoder into local processing elements, in some embodiments, all of the XOR signals become local to the local processing elements in which they are formed. The inputs to the Equals gates become globally routed signals that come from multiple local processing elements. In some examples, the local processing elements 690 can be configured in a way such that each shared module 690 requires only output values from a pre-defined set of three other local processing elements. As a result, the coupling between each local processing element to the global control unit 640 can be reduced, for example, with read circuitry 670 now being coupled to only 3 (instead 8) selection units. In some examples, the local processing elements 690 can be further arranged such that all of the even-numbered (i.e., 0, 2, 4, and 6) local processing elements communicate with each other but not with the odd-numbered (i.e., 1, 3, 5, and 7) local processing elements (except for the last eight block columns of the check matrix).

Note that, in some applications relating to soft decoding, the decoder described above is used for converting input "soft" bits based on individual measurements of each bit to soft bits each based on the entire block of soft bits, taking into account the constraints that the original bits of the block satisfied. These output soft bits can then be further processed, or converted by hard decision into output "hard" bits taking values 0 or 1. The input soft bits may be provided in the probability domain, for example, as the probability of a bit being value of 1 or 0. Alternatively, the input soft bits may be provided in the log domain, for example, as the log likelihood ratio of a bit (e.g., as defined by $$\log\left(\frac{p(b_i = 0 \mid y_i)}{p(b_i = 1 \mid y_i)}\right).$$

In either case, the shared module 590 can be implemented using a set of analog circuit components that perform analog computation functions appropriate for the particular application. Implementations of some of these analog circuit components (such as soft Equals and soft XOR) are illustrated in detail in U.S. patent application Ser. No. 12/716,148, titled "Circuits for Soft Logical Functions," filed Mar. 2, 2010.

Figure 14:
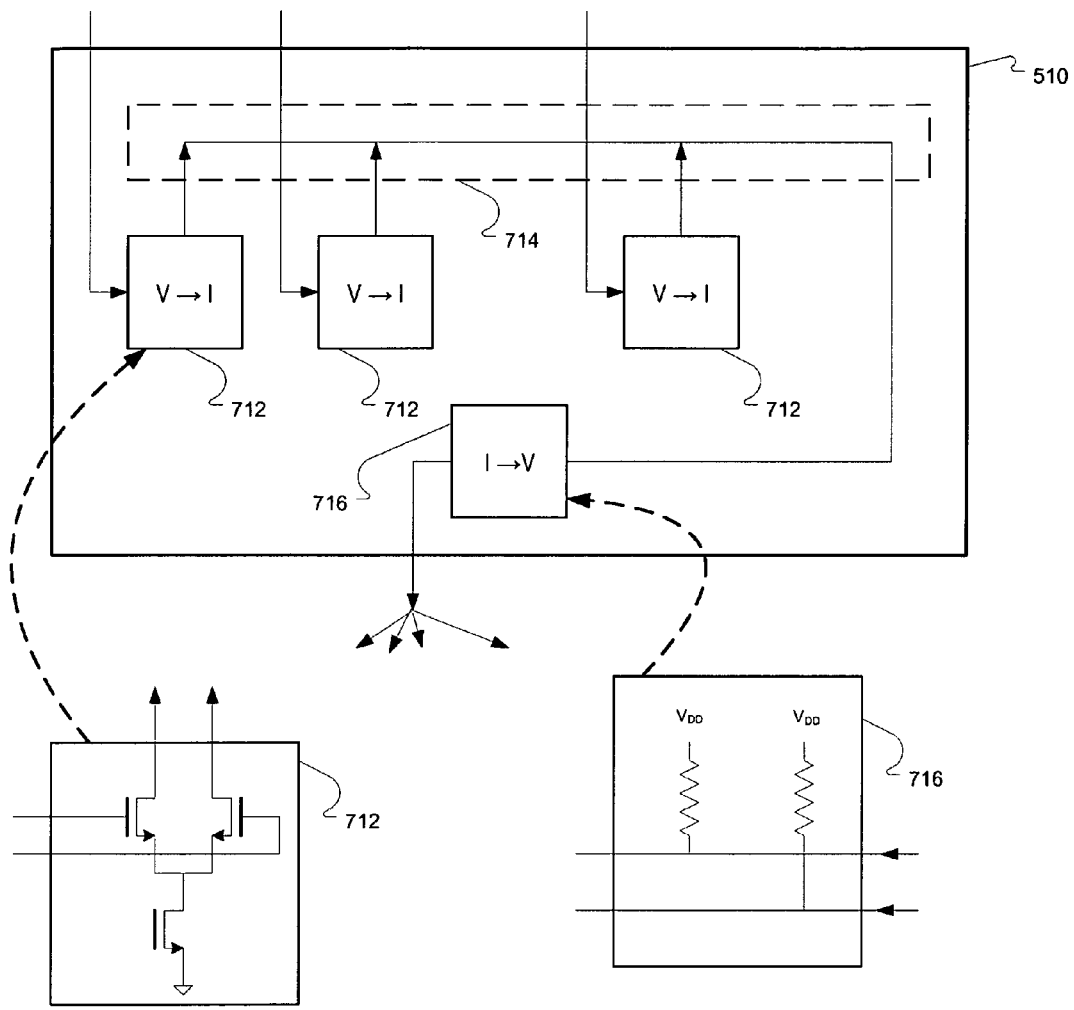
FIG. 14 is a circuit implementation of a variable node.

Referring to FIG. 14, in some implementations, the soft equals makes use of differential voltage inputs, each representing a log likelihood ratio to produce a voltage that is proportional to the sum of the inputs. Each differential voltage input is passed through a voltage to current converter 712, and the resulting currents are summed on a bus 714. The current on the bus is passed through a current to voltage converter 716. The output voltage then branches to the soft XOR circuits that require the output of this equal node. Exemplary circuit implementations are shown in the figure. A variety of alternative circuits can be used, including alternative soft Equals circuits described in U.S. patent application Ser. No. 12/716,148.

Figure 15A:
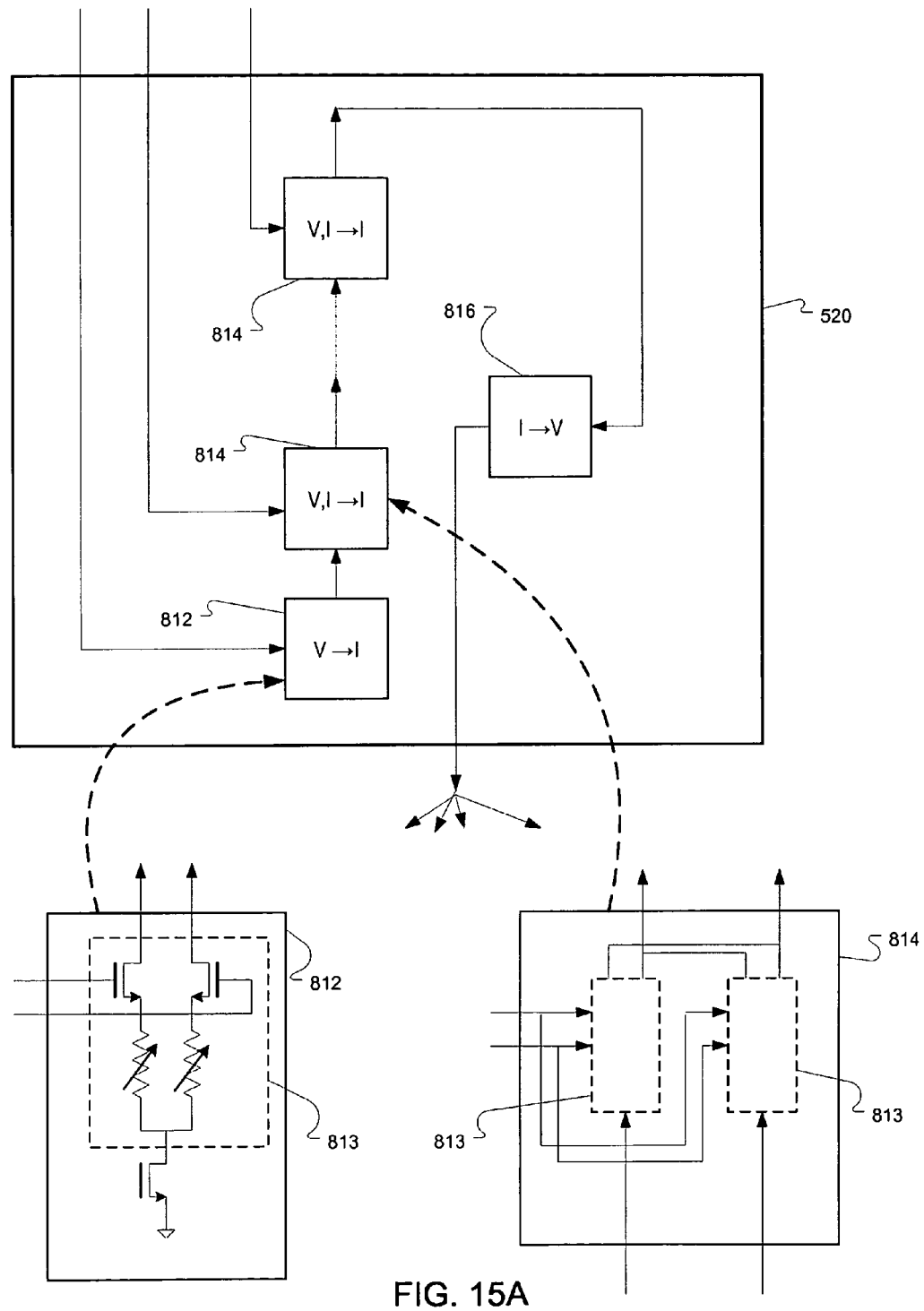
FIG. 15A is a circuit implementation of a constraint node.

Referring to FIG. 15A, in some implementations, the soft XOR circuits make use of log domain differential voltages as produced by the circuit shown in FIG. 14. In the exemplary implementation of the soft XOR circuit shown in FIG. 15A, which approximates an ideal soft XOR function for log domain processing, one differential voltage input is passed to a circuit 812. The second and further inputs to the soft XOR circuit are passed to circuits 814, each of which performs an analog computation that approximates multiplication of the current provided by the previous element according to that input. The resulting current approximates the ideal soft XOR function each of the inputs and is passed through a current to voltage converter 816, to provide the differential voltage output of the soft XOR. Note that unlike the soft Equals circuit shown in FIG. 14, the output of the overall soft XOR circuit does not fan out on any particular cycle, because the output of the soft XOR circuit provides the input to only a single memory cell. The circuit parameters, for instance, resistance values, transistor dimensions, and voltage scaling, are chosen to best approximate the ideal function of a soft XOR and/or to optimize higher level (e.g., overall decoding) system performance.

Figure 15B:
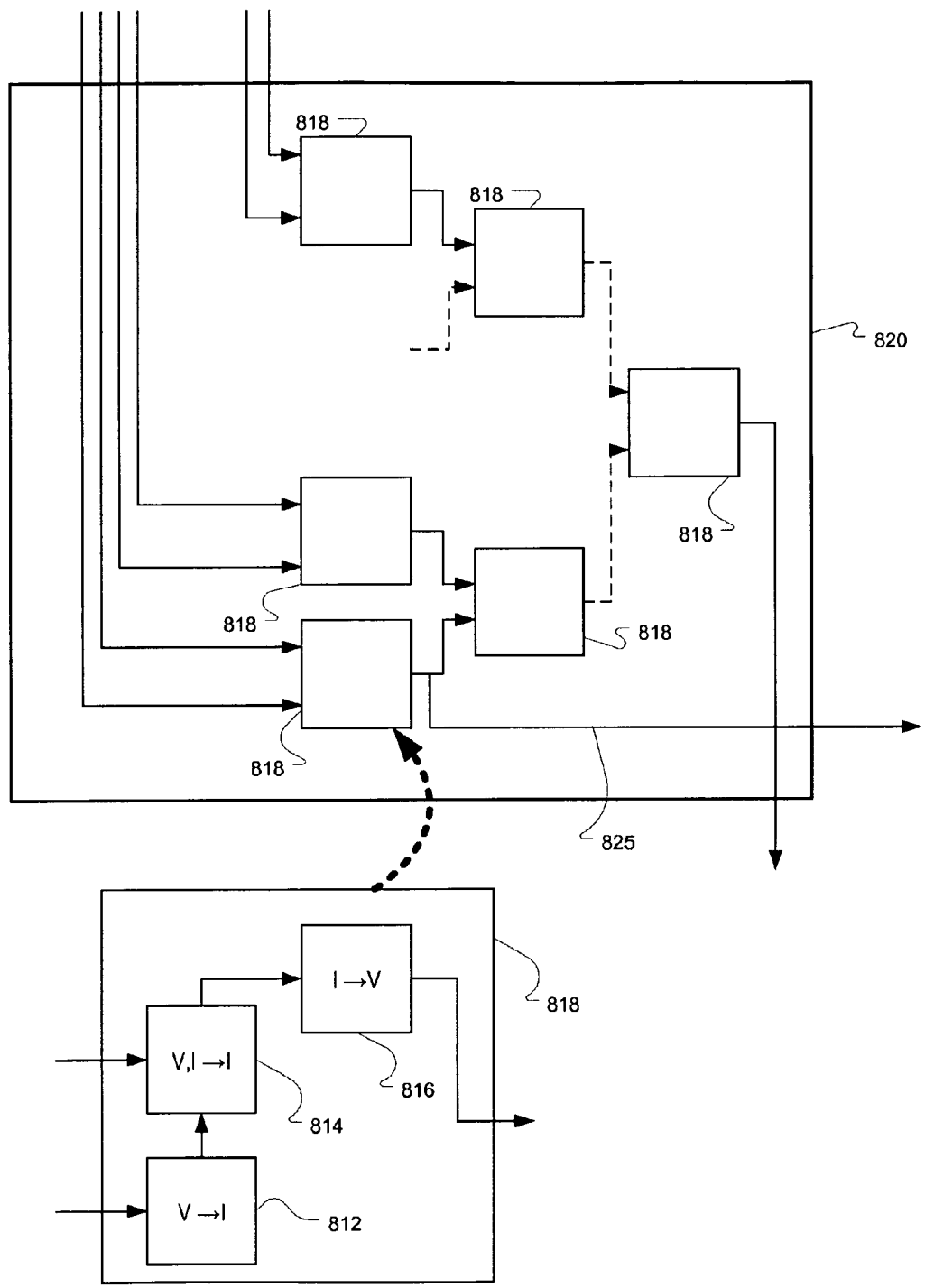
FIG. 15B is an alternative implementation of a constraint node.

Referring to FIG. 15B, an alternative arrangement 820 of circuit elements to the soft XOR circuit 520 shown in FIG. 15A implements the directional soft XOR circuit using a branching tree structure, optionally sharing signals between different trees associated with a same bidirectional check node. Specifically, groups of circuit elements 818 effectively form two-input, one-output, voltage based soft XOR circuits using the circuit elements 812, 814, and 816 introduced with reference to FIG. 15A. These groups of circuit elements 818 are then arranged in a tree structure, preferably a binary tree structure that is as balanced as possible to form the circuit arrangement 820 shown in the figure. In some implementations, the branching structure shown in FIG. 15B may have preferable characteristics, for instance, providing a better approximation of the ideal soft XOR function with LLR representations. Furthermore, when multiple modules 820 are implemented for a set of unidirectional XOR circuits, certain computations can be shared, for example, by passing a signal 825 from one module to another where a portion of the tree in that other module can be eliminated.

Figure 16:
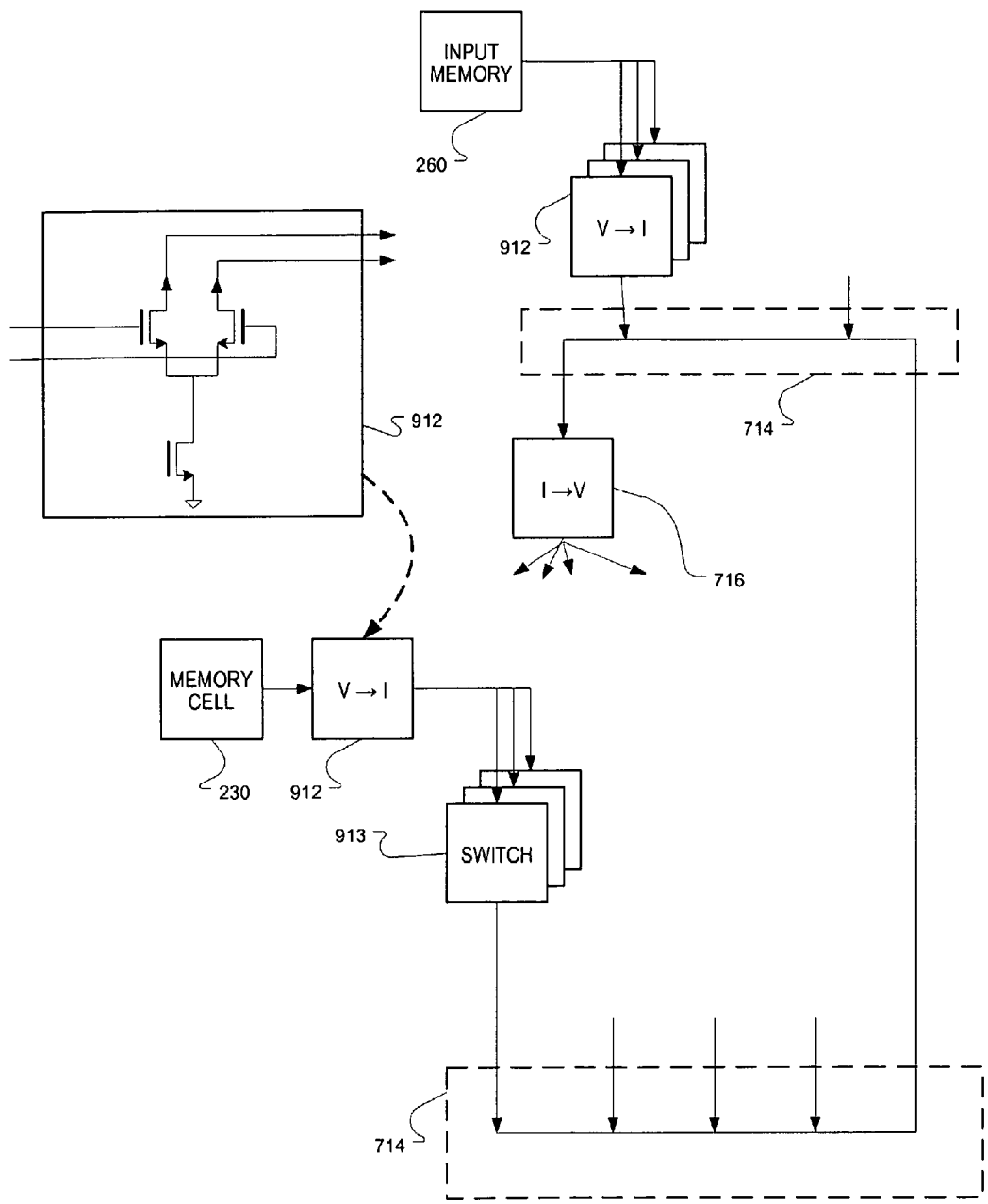
FIG. 16 is a diagram that illustrates a distributed bus implementation of a variable node.

Referring to FIG. 16, in some implementations, the bus 714 associated with each equal gate is distributed. Each memory cell 230, which stores its value as a differential voltage, has at its output a corresponding voltage to current converter 912. These voltage to current converters are similar to the converters 712 shown in FIG. 14. The current output is passed to a set of switches 913, at most one of which is enabled if the corresponding cell's value is to be injected as a current on a current bus 714 corresponding to that switch 913. Each bus 714 similarly includes a portion onto which current associated with an appropriate input bit is injected at each cycle to account for the input to the equal gate corresponding to the bit input. Note that the bus 714 for each equal node may have a complex structure, for example, having numerous branches. Nevertheless, all the current injected onto the bus passes to the current to voltage converter 716 for the equal node, from where it branches to the unidirectional XOR circuits that require that output.

Figure 17:
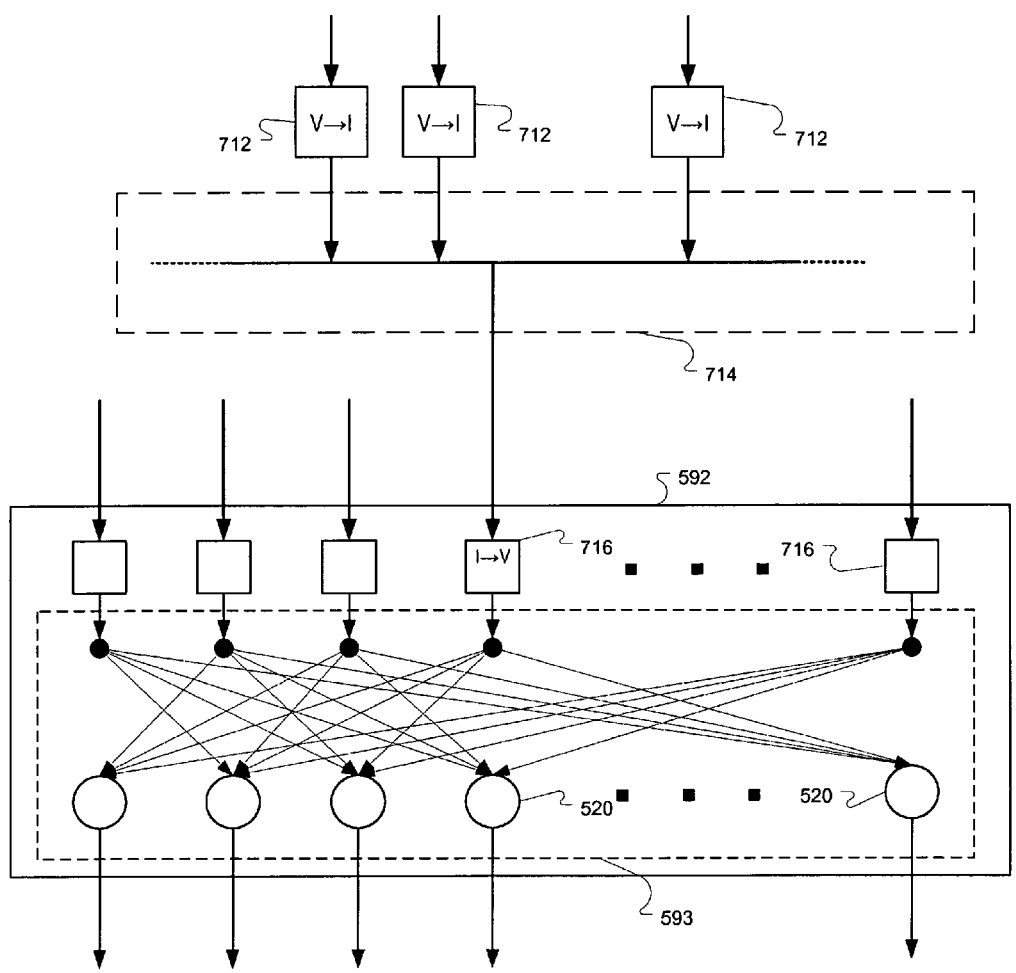
FIG. 17 is a diagram of an alternative shared module.

Referring to FIG. 17, in some implementations that make use of a distributed bus 714 to perform a current summation function, the module 590 illustrated in FIG. 12 is replaced by a module 592 in conjunction with distributed busses 714 and voltage-to-current converters 712. In module 592, each variable node corresponds to a current-to-voltage converter 716, which outputs a voltage proportional to the total injected current on the corresponding bus 714, and then that voltage branches to the appropriate check node circuits 520. Note that in yet other implementations, the current-to-voltage converters 716 are themselves distributed, and a module 593 (i.e., a portion of module 592) receives voltage inputs, which are internally distributed to the appropriate check node circuits.

Figure 18:
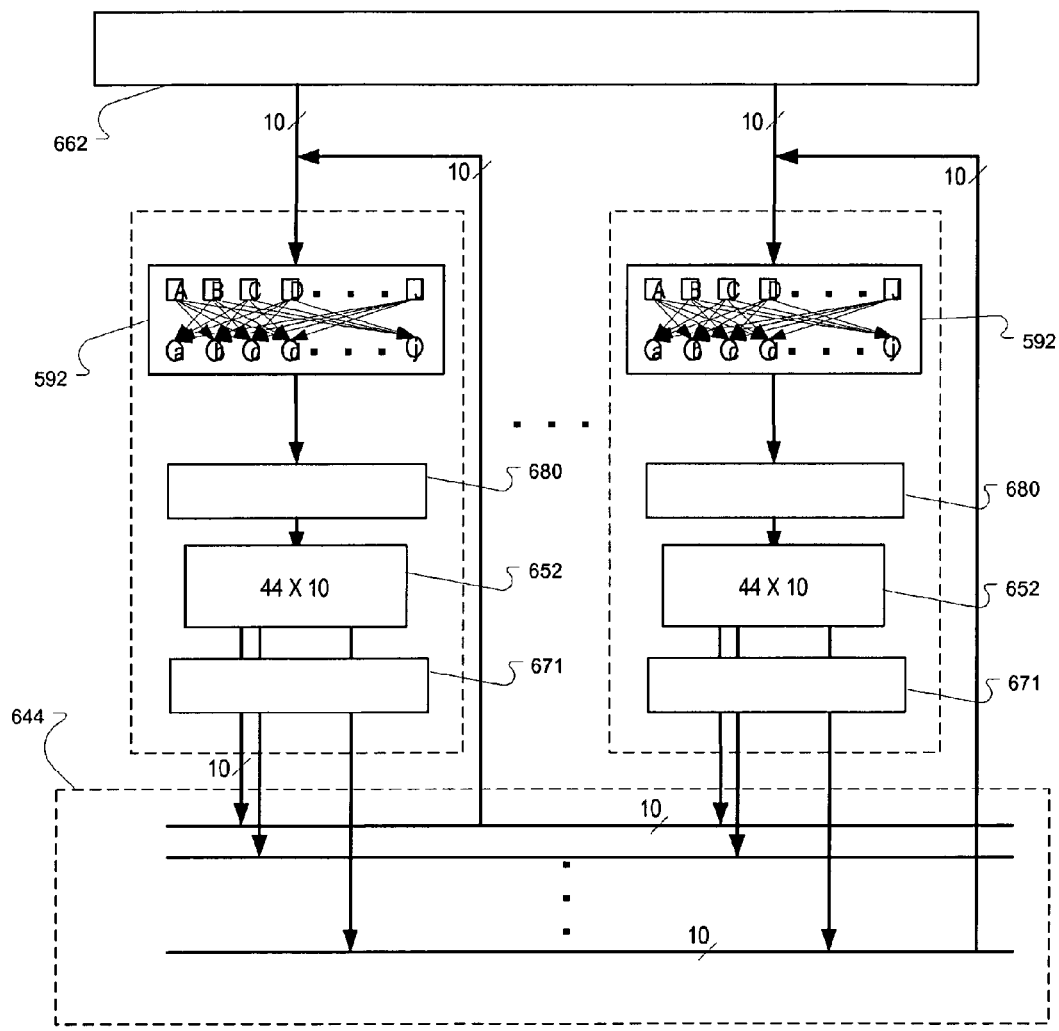
FIG. 18 is a block diagram of a decoder that uses distributed bus implementations of variable nodes.

Referring to FIG. 18, a second example of an implementation of a decoder operable to perform the iterative stage of decoding operation for use with the (1056, 352) LDPC code shown in FIG. 11 provides the same or similar functionality to the implementation shown in FIG. 13. In this example, modules 592 are used, as illustrated in FIG. 17. The circuitry that implements each soft Equals circuit associated with a variable node includes a current-to-voltage converter in the module 592, with the distributed busses corresponding to the 10 unidirectional variable nodes of the module 592 being distributed. Each memory 652 includes circuitry to inject current to the appropriate busses corresponding to the soft Equal circuits for different variable nodes via read switching circuits 671. The bus section 644 effectively includes 81 busses, each associated with a different current-to-voltage converter 716 at the input of a module 592. Therefore, the soft Equal circuit is distributed in a manner effectively forms interconnection paths between the memories 652 and the analog computation modules 592.

2 Additional Embodiments

2.1 Memory Access Scheduling

In some examples, system is configured using an incremental "scheduled" approach such a subset of values is updated and available for use at the end of each cycle rather than at the end of an entire iteration composed of multiple cycles. In some such examples, for example using a single block 390 as shown in FIG. 8, there is no conflict between memory cells that are read in a cycle and locations that are being written in a cycle. The reason that there is no conflict can be understood with reference to FIGS. 7A-B. For example, applying a constrain corresponding to row 0, the memory cells corresponding to non-zero entries in that row are written, while memory cells in other rows, specifically in columns that have non-zero entries in row 0, are read.

Referring again to FIG. 10, when two or more update modules 490 are used, it is possible that a memory cell being updated in one module is to be read in the same cycle in another module. This can be understood again with reference to FIGS. 7A-B, for instance, in a case where one module is applying the constraint associated with row 0 and another is applying a constrain associated with row 1. The application of the row 0 constraint writes C0,1 and reads C1,1, while application of the row 1 constraint writes C1,1 and reads C0,1.

In another implementation a memory 250 for an incremental approach does not required twice the capacity of the entire memory. Here, in the first half of clock cycle k, the read circuitry retrieves some values from the memory, some of which may have been updated in a preceding clock cycle k−1. The outputs of the XOR gates are written back into the same memory during the $2^{nd}$ half of clock cycle k. In some examples, by using edge-sensitive (instead of level-sensitive) memory, the read and write operation in the same clock cycle would not interfere with each other.

2.2 Memory Arrangement

In another implementation of a decoder for the (1056, 352) LDPC code uses a different arrangement of memory cells, and takes advantage of the distributed current summing approach to implementing the log likelihood ratio based equals gates. The implementation makes use of a schedule in which multiple constraints are applied at each cycle of an iteration, and the updated values are used in the next cycle of the iteration. Referring to FIG. 11, a previously described approach applies eight constraints in each cycle, with each constraint being associated with a different row block. As discussed above, there are situations in which the same cell 230 is both written and read in the same cycle, and therefore approaches such as double buffering and multiple phases (update, write, etc.) per cycle are used. In the present implementation, multiple constraints are applied in each cycle, and these constraints are selected such that there is no read and write conflict on the memory cells, permitting a scheduled approach without the need for approaches such as double buffering. One way to avoid the conflict is for each of the constraints being applied in a cycle to come from the same row block. The reason this avoids conflicts may be understood with reference to FIG. 7A, which relates to a simpler length 8 code. As illustrated, a constraint corresponds to a row in the code matrix, and the cells that are updated are associated with the non-zero entries in that row. The cells that are read are in the columns in which that the constraint's row has non-zero entries. If another constraint is applied in the same cycle, but the row associated with that constraint as no non-zero entries in the same columns as the row for the first constraint, then the cells updated for the second constraint are not read for applying the first constraint, and the cells read to apply the second constraint are disjoint from those read for the first constraint. Turning back to the code matrix illustrated in FIG. 11, it is evident due to the offset diagonal structure of each non-zero block that multiple rows from the same row block have the property that no two rows have ones in any of the same columns. Therefore, multiple constraints corresponding to multiple rows in one row block can be applied in one cycle without read/write conflicts. As another observation, two rows one in an even block 2n and one in an odd block 2n+3 mod 8 (or odd block 2n+5 mod 8) similarly cannot have any columns with non-zero entries in common due to the overall block structure of the code matrix.

Figure 19:
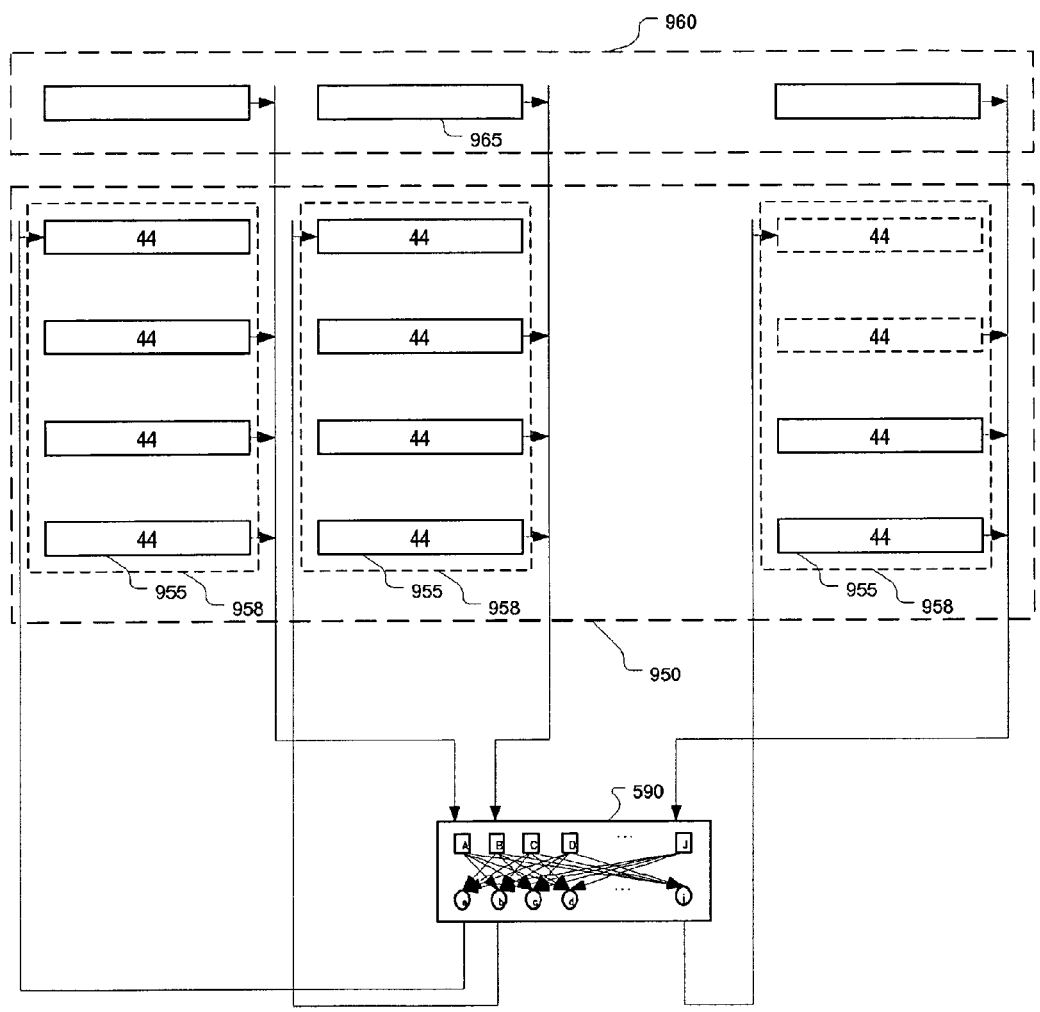
FIG. 19 is a block diagram of an alternative architecture for a decoder for a (1056, 352) LDPC code.

Referring to FIG. 19, a partial illustration of an instance of this approach arranges the memory cells 230 of the memory 950 into groups 955 of 44 memory cells. Each of these groups 955 corresponds to a different non-zero block of the code matrix shown in FIG. 11. Further, these groups are arranged into banks 958 each corresponding to a column in the same way that they are arranged in the code matrix. For the first 24 columns, there are exactly four memory groups 955 corresponding to the four non-zero blocks in each column block. Each of the last eight columns have two or three memory groups each.

In FIG. 19, a single module 590 is shown, representing the update logic to apply a single constraint in a cycle. As discussed previously, each equal node in the module receives up to four inputs, up to three from the memory cells within the memory 950 and one from the input registers in memory 960, which is also arranged into groups 965, each associated with a different column block. The equal node uses a distributed current bus approach, as described above, onto which the current encoding log likelihood ratios are injected. FIG. 19 illustrates application of a constraint in the first row block. In the first bank of memory groups 955, one memory cell in the first memory group 955 is updated, and one memory cell from each of the other memory groups 955 is read as well as one input from an input register in a register group 965 associated with that column block. Each of the 10 (or 11 depending on the row block) inputs to the module 590 comes from one bank of memory groups 955.

As is discussed further below, the off-diagonal structure of the blocks constrains which combinations of memory cells are coupled to the current bus in any one cycle. Specifically, the combinations of memory cells must be found in a same column of the check matrix. Therefore, if the memories 955 are indexed by column within the block column, then in any particular cycle a same index is applied to each memory 955 in a bank 958 and the input memory group 965. Note also that with an arrangement indexed by column, contiguous columns are naturally indexed contiguously, treating wrapping from the highest index (43) to zero as contiguous.

Figure 20:
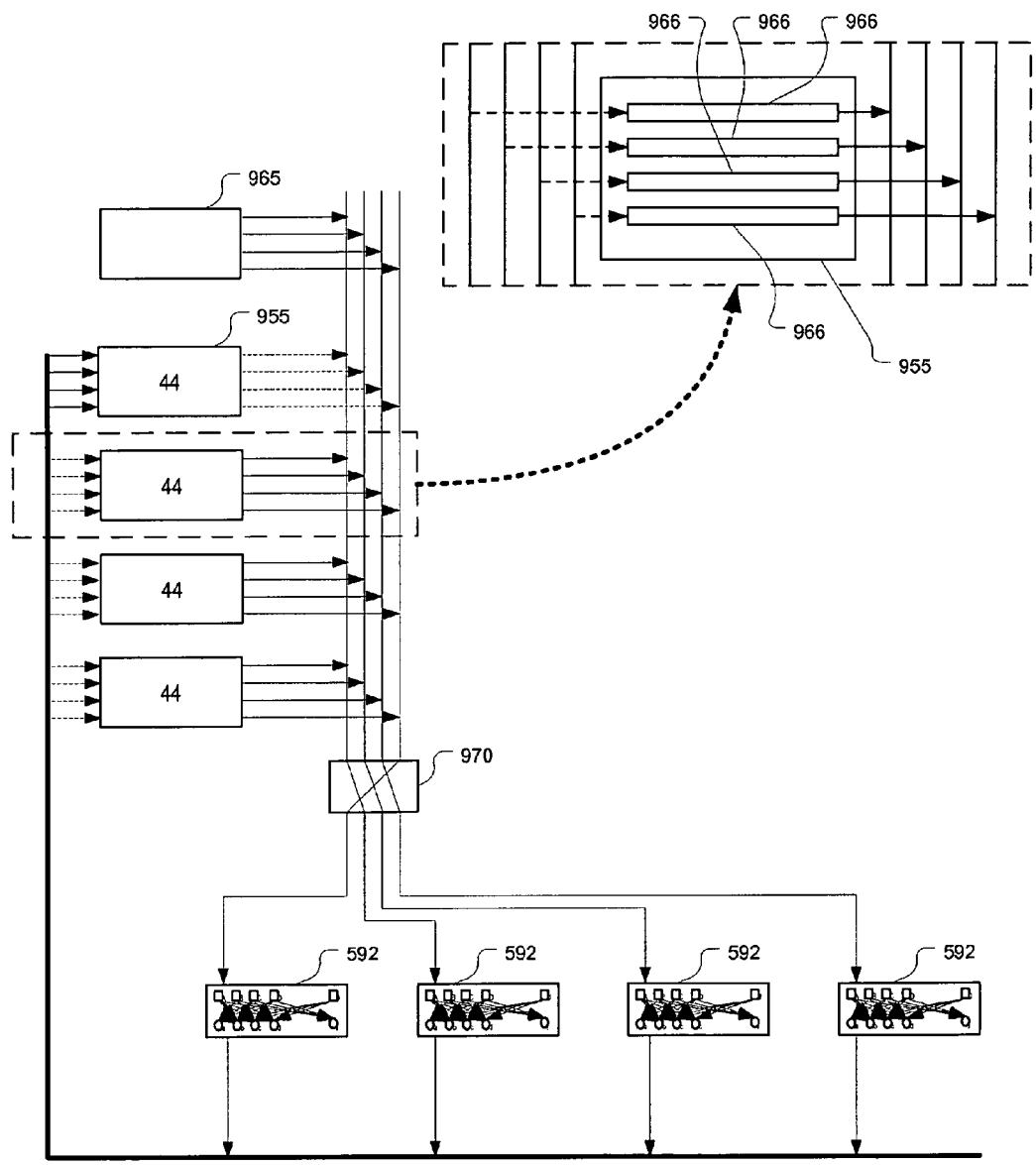
FIG. 20 is a block diagram that shows multiple update modules in the architecture shown in FIG. 17.

In some examples, multiple constraints in a row block are applied in each cycle. For example, four constraints corresponding to four contiguous rows may be applied in each cycle. Referring to FIG. 20, as compared to FIG. 19, such an example has four copies of the module 592, and each distributed equal node has as a separate input bus. For updates of four contiguous constraint rows within a row block, for each block column, four contiguous columns are read or written in each bank 958 of the memory groups 955. As in the example shown in FIG. 19, the memory locations in a same column are coupled to a same bus, and therefore outputs of four contiguous columns for a memory 955 are each output to a different of the four busses. Similarly, the updates to the updates of the memory group 955 in contiguous groups of four memory cells in one of the groups 955. Each memory group 955 is arranged in four groups 966 of eleven memory cells each, with each group 966 being coupled to a corresponding one of the four busses. For instance, one memory group 966 has memory cells for the within-block column indices 0, 3, 7, . . . 40 (i.e., columns indices 0 mod 4), a second for column indices 1, 4, . . . 41 (i.e., 1 mod 4), and so forth. In any cycle, one cell from a group 966 is coupled to the bus and one cell from the group 966 is written to. In each block column, the column that is applied associated with the first module 590 depends on the offset of the block diagonal in the block being updated. Therefore, if the first constraint row has a non-zero entry in that block column at an index i, a shifter 970 "rotates" current bus i mod 4 to the $0^{th}$ module 590, bus (i+1) mod 4 to the $1^{st}$ module, (i+2) mod 4 to the $2^{nd}$, and (i+3) mod 4 to the $3^{rd}$.

In some examples, the function of a soft Equal circuit is distributed such that the output of a memory group 966 is a current, which is summed on a bus as illustrated in FIG. 20. Then the shifter 970 includes a current to voltage conversion circuit for each bus at its input, and then shifts the resulting voltages to modules when each voltage encoded input is applied to the inputs of appropriately selected soft XOR circuits. The module 592 is then replaced with a module 593, which accepts voltage rather than current inputs.

Note that a number of further optimizations can be used to take advantage of structure of the code. For example, four constraints from row block 2n can be applied at the same time as four constrains from row block (2n+3 mod 8), thereby allowing eight constraints to be applied in each cycle. Note that of the first 16 banks of memory groups 955, memories in an even block row are updated based on an update based only on even block rows in the first 16 block columns, and odd block rows in the last 8 block columns. Similarly, memories in an odd block row are updated based only on odd block rows in the first 16 block columns and even blocks rows in the last 8 block columns (with the exception of block (6,16) which is used to update block (0,16) and vice versa.

In various examples, different schedules for associating sets of constraints with cycles can be used. For example, with four modules 590, the constraints applied in each cycle can proceed as {0, 1, 2, 3}, {4, 5, 6, 7}, . . . {40, 41, 42, 43}, {44, 45, 46, 47}, {348, 349, 350, 351}, in 88 cycles for each iteration. As another example using eleven modules, the cycles can proceed as {0, 1, . . . 10}, {11, 12, . . . , 21}, {341, 342, . . . , 351} in 32 cycles in each iteration. As another example, with two sets of four modules 590 (i.e., eight total, four for block 2n and four for block 2n+3), the constraints applied can proceed as {0, 1, 2, 3, 132, 133, 134, 135}, {4, 5, 6, 7, 136, 137, 138, 139}, . . . , {40, 41, 42, 43, 172, 172, 173, 174}, {88, 89, 90, 91, 220, 221, 222, 223}, . . . in 44 cycles.

Figure 21A:
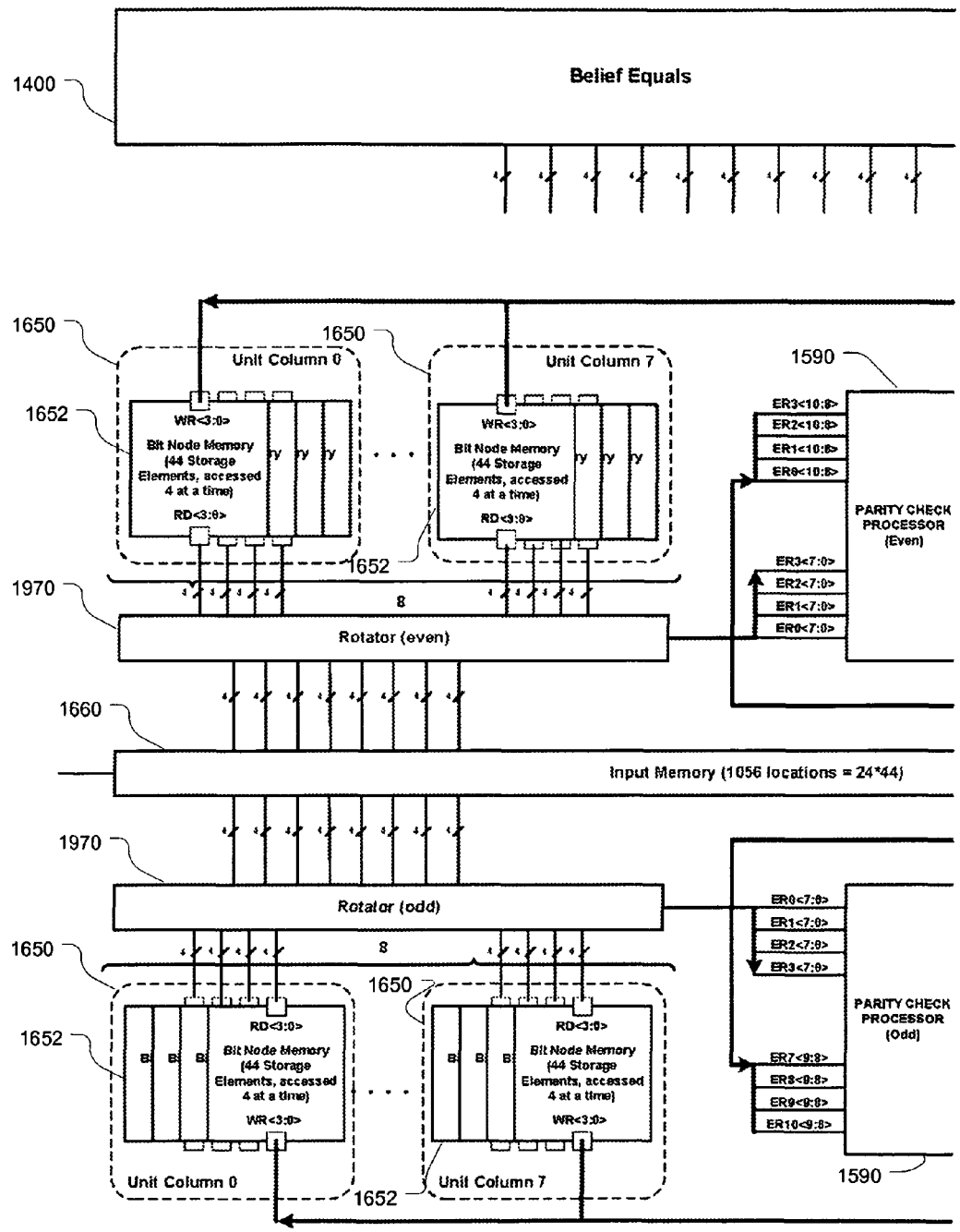
FIGS. 21A-B are a block diagram of an implementation of a decoder.
Figure 21B:
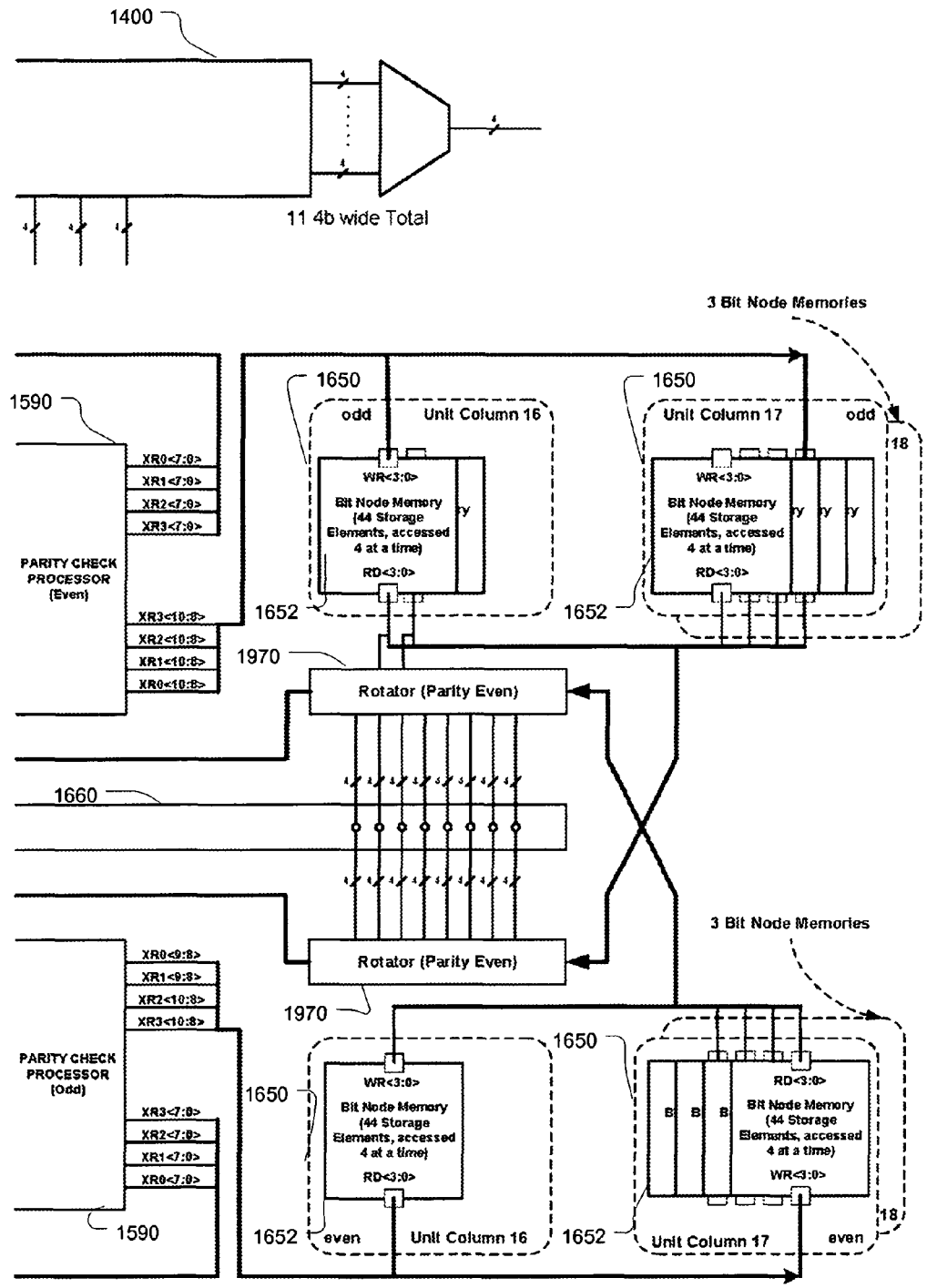

Referring to FIGS. 21A-B, an overall diagram for an implementation of a decoder for the code with check matrix shown in FIG. 11 is shown. An input memory 1660 holds the 1056=24×44 input values, represented as voltages proportional to the LLR inputs. In some examples, these values are loaded, for example, four at a time, in a serial manner before the iterative stage begins. In some examples, the LLR values are obtained from a signal mapping circuit that accepts one or more of the signal values $y_i$ and outputs one or more of the LLR values. In some examples, one signal input generates a set of LLR inputs, for example, when multi-level encoding is used, such as when four bit values are encoded in a sixteen-level analog signal. Generally, the architecture shown in FIGS. 21A-B has separate parts for the "even" and the "odd" block rows, which as introduced above allows concurrent processing of constraints in different block rows without read-write contention for memory cells. A set of memory banks 1650 include memories 1652, each holding 44 entries corresponding to a corresponding block of the check matrix. Each bank includes only either odd or even block rows in a particular block column of the check matrix. Together, these banks correspond to the memories 955 shown in FIG. 19. Two parity check processors 1590 are illustrated. Each implements four analog computation modules generally of the form of module 593 that is illustrated in FIG. 17. The memory banks 1650 are coupled to the parity check processors 1590 via rotator modules 1970. Generally, each rotator module 1970 includes a set of four rotators each associated with one of the four analog computation modules that are in the corresponding parity check processor 1590. Note that these rotator modules include current to voltage conversion circuits such that the links between the memory banks 1650 and the rotator modules 1970 are differential current encoded, while the links between the rotator modules 1970 and the parity check processors 1590 are differential voltage encoded. The outputs of the parity check processors 1590 are passed to the appropriate memory banks 1590 where the determined values are stored. An output section 1400 is coupled to the memory banks 1650 and to the input memory 1660, and includes the circuitry for computing the output values, which may be computed multiple outputs at a time an multiplexed. Not shown is the control logic that coordinates the configurations of the rotators and read and write control logic within the memory banks.

2.3 Signal Representations

It should also be understood that various modifications of the approaches described are possible. For example, memory elements are not necessarily analog and/or continuous valued. For example, digital (e.g., storage for binary (base 2) digits, possibly in "soft" forms) and/or quantized storage may be used. Other representations of the values passing between nodes can be used. In some examples, log likelihood ratios are used. Other possibilities include passing of linear probabilities. With different representations, different circuit implementations of the equal and constraint nodes would be used. Various encodings of the representations may be use. In some examples described above, differential voltage and differential current encodings are used. Alternatives include stochastic (e.g., dithered) representation, digital or quantized representations.

2.4 Current-Mode Storage Cell and Processing Elements

Figure 22:
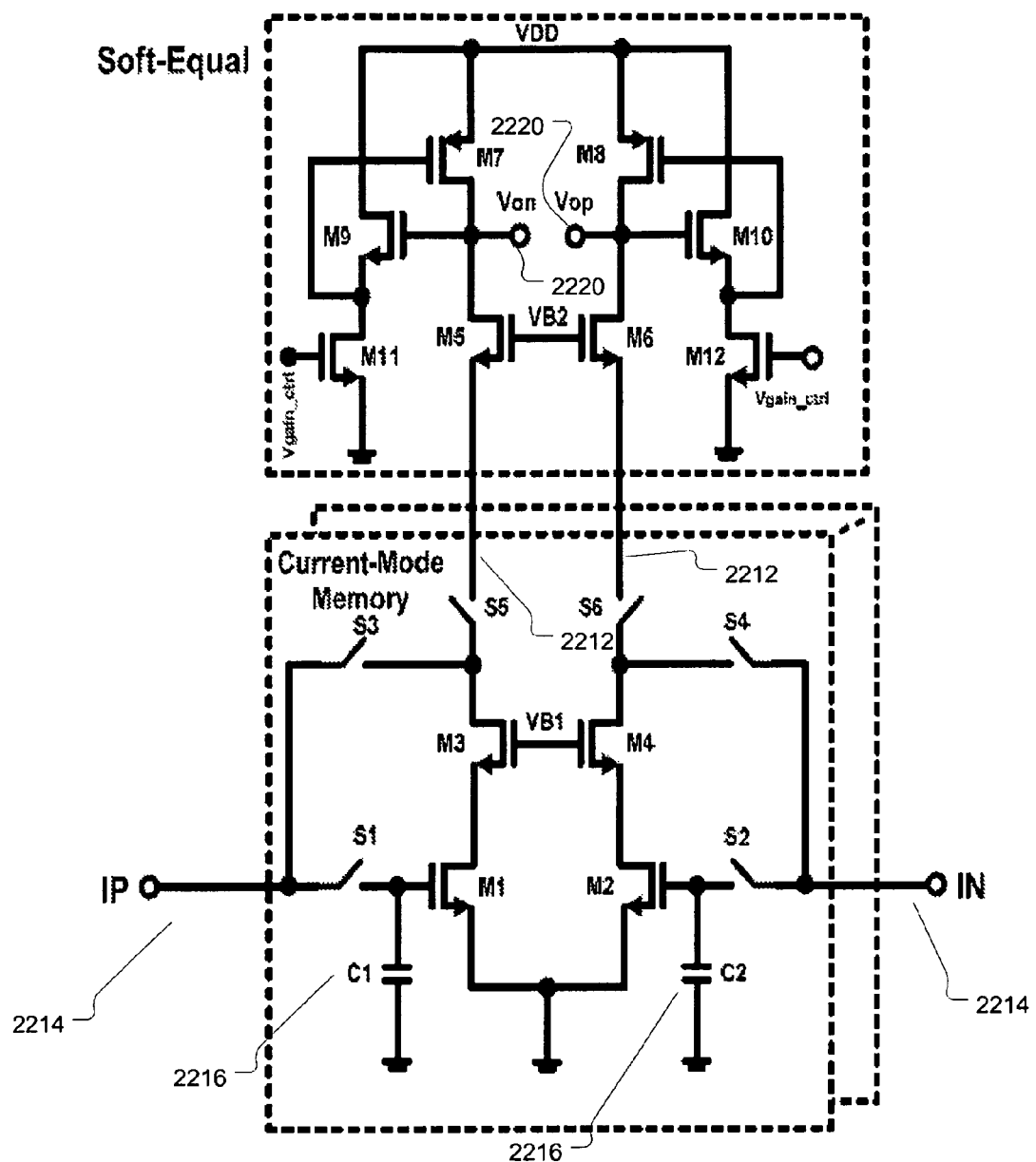
FIG. 22 is a schematic including differential current storage cell and a current input Soft Equals gate.

Referring to FIG. 22, a differential current memory cell 110 works as follows. In a writing mode, an input value is represented by the differential current on inputs 2214 (labeled IP and IN). In the writing mode, switches S1, S2, S3, and S4 are closed and switches S5 and S6 are open. The input current causes a state to be stored in the capacitors 2216 at gates of transistors M1 and M2. The write speed depends on the transconductance of M1 and M2. The cascode transistors M3 and M4 are used to reduce the message error due to channel length modulation of transistors M1 and M2.

In a later reading mode, switches S5 and S6 are closed and the remaining switches are open. Because the gate voltages, which are maintained in the capacitors, match the voltages needed to reproduce the original input currents, the output currents through the output leads 2212 match the input currents, and are not sensitive to any transistor mismatches.

Referring to FIG. 22, a differential current input Soft Equals accepts multiple differential current encoded signals on input lines 2212 (i.e., from multiple memory cells), and produces a differential voltage encoded output on output 2220 such that the voltage is proportional to the sum of the input currents.

In the circuit shown in FIG. 22, transistors M7 and M8 are biased in the triode region. Source followers M9-M12 are added to eliminate the soft-equal resistance dependency on its output signal swing and widen the soft-equal linear range. Two NMOS transistors M5 and M6 provide the virtual ground at the current mode memory cell output. The soft-equal output signal amplitude is determined by the linearized resistance of PMOS transistors M7 and M8 which is regulated by the control voltage applied at the gate of the NMOS current source transistors M11 and M12.

The description in prior sections above includes implementations of an LDPC decoder in which each equal gate includes a current summation and an explicit current-to-voltage conversion stage using resistors coupled to a reference voltage (e.g., $V_{DD}$). In another implementation, these Soft Equals gates are replaced with the circuit implementations shown in FIG. 22.

In one or more of the above implementations described in prior sections, the outputs of the Soft XOR gates also include explicit current-to-voltage conversion elements (e.g., resistors), to produce voltage signals to produce voltage inputs to the memory cells at the outputs of the Soft XOR gates. In the present implementation, this last current-to-voltage stage is not required because the memory cells as shown in FIG. 22 directly accept current encoded inputs.

In one or more of the earlier implementations, the output of each memory cell includes a voltage-to-current conversion before passing the current encoded signals for summation in the Soft Equals gates. In the present implementation, such conversion is not required. Note that in some implementations, the previous implementation allowed the voltage output of the memory cell to drive multiple voltage-to-current converters permitting a "fanout." In some implementations using current mode memory cells, the fanout is introduced before a set of memory cells at a voltage stage in the Soft XOR.

2.5 Gain Control

The Gilbert multiplier based Soft XOR gate shown in FIG. 23 takes the soft-equal (check node) output and depending on applications, the voltage output Soft XOR might be required to perform message passing/belief propagation before the Soft XOR with current output sends the belief to the current-mode memory. The voltage input and voltage output Soft XOR has linearized PMOS triode transistors which can be adjusted to meet the proper gain requirement.

A fraction of gain variation for the signal chain could affect the bit-error-rate (BER) by one order of magnitude. Essentially, there are two gain stages for the current-mode memory based signal chain. One is from the input of voltage-input current-out soft-xor to the output of soft-equal. The other one is simply the voltage-in voltage-out soft-xor.

The gain calibration from the input of voltage-in voltage-out soft-xor to the output of soft-equal involves two major periods: offset sampling and gain calibration. Initially, the common mode reference voltage is connected to the XOR input differential pair M1 and M2. In the same time, the peak differential inputs VPKP and VPKN will be applied to the other input differential pair M3-M6. The switches S1, S2, S5 and S6 in the current mode memories will be constantly closed; and S3 and S4 open. The auto-zeroing networks samples and holds the offset voltage during this period. Next, the input reference voltage VRPI and VRNI will be applied to M1 and M2. The differential output voltage VOP-VON of soft-equal will be regulated to be equal to VRPO-VRNO by the fully differential difference amplifier, the other high gain amplifier, and the source follower branches M9-M12 in the loop with the offset voltages being eliminated by the auto-zero networks.

In some implementations, a soft equal circuit features an active MOS resistor that senses the voltage across itself and adjusts it's own bias (Gate Voltage) as to keep on resistance constant independent of the voltage swing across it, for instance, instead of using just a MOS (in this case PMOS) transistor as the resistive load to the summer of the currents. We achieve this feature by adding a source follower to the MOS resistor that takes as it's input a drain voltage of the controlled MOS transistor and produces MOS transistor gate control voltage as it's output. This way the ON resistance of the controlled MOS resistor can be set by the geometries of the controlled MOS resistor and the source follower device and can be finely controlled by the source followers bias current.

In some examples, the device may have somewhat unpredictable characteristics, for instance, that depend on particular fabrication time (process) or run-time conditions. For example, gains of transistors may depend on process characteristics or on operating temperature of the device. Some designs include selectable and/or configurable gain elements, for example, to adjust the gains of soft XOR circuits, gains of current to voltage conversion circuits, gains of current outputs of memory cells, etc. In some examples, gain is adjusted by controlling resistance elements, such as but not limited to, resistive elements in current to voltage converters 716 (see FIG. 14) or circuits 812 and 814 (see FIG. 15A) or circuits 816 (see FIG. 15B), for example, at the last stage of the tree of two-input XOR stages. The gain control can be provide in digital form, and passed through a digital-to-analog converter to an analog-controllable resistive element (e.g., an appropriately biased transistor). In some examples, these gains are adjusted to optimize overall system performance, for instance, in a system calibration stage before operational use or in an ongoing (e.g., feedback) adaptation of the elements to maintain optimal or near optimal performance.

In some examples, an autozeroed process-voltage-temperature compensated automatic gain control for analog logic gates is used. The circuits has analog logic gates with fixed gain from input to output that is set to be independent of manufacturing process-supply voltage-operating temperature variations. Such feedback control loops have not been previously used to implement gates that perform statistical computations.

3 Alternatives, Applications and/or Implementations

It should be understood that the decoder applications described above are only one example of an application of an analog belief propagation processor. The techniques employed in these examples are applicable to other uses of belief propagation.

Implementations of the belief propagation processors may have different degrees of customization to particular applications. Generally, a controller (not shown) sequences the application of different constraints in different cycles of an iteration, and sequences the series of iterations to complete a computation. The controller can be a special-purpose controller or sequencer that is configured for a particular code, for a particular class of codes, or to some other class of computations. The controller may also be a general purpose controller that may be used to implement a wide variety of computations. In some implementations, the modules that include the variable and constraint nodes may have fixed structures, or may be configurable. Circuit configuration may occur through the operation of the controller and/or the configuration may be implemented through a field programmable approach in which certain connections between circuit elements are enabled using personality data that is applied to the processor. In some cases the controller is implemented on the same device that implements the analog circuit portions of the processor, while in other cases, the controller is fully or partially implemented in a separate device that is in communication with the device implementing the analog processing.

The belief propagation processor may be used in many applications. One application relates to communication systems, where the belief propagation processor is used as a soft decoder subsequent to a soft demapper that converts signals transmitted over a noisy communication channel into soft bits. The soft bits may be represented in the probability domain (e.g., as probabilities or differential probabilities), or alternatively, in the log domain (e.g., as log likelihood ratios or log-odds). Examples of soft demappers are described in detail in U.S. patent application Ser. No. 12/716,113, titled "Signal Mapping," which is incorporated herein by reference.

One application of a decoder implemented in using an analog belief propagation processor is in a communication system in which blocks of transmitted information are received, and the decoder performs an error correction of the received information. Another application of such a decoder is as a component of a data storage system, for instance a semiconductor memory (e.g., flash memory, which may include multilevel cell storage) or a disk storage memory, in which the decoder performs an error correction of the information retrieved in the storage system, for example, retrieved as storage levels in memory cells or as degrees of magnetization in a disk storage system. In some examples, the decoder in integrated on the same device as a semiconductor memory, while in other examples, the decoder is implemented in a separate device (e.g., on a separate integrated circuit). Some examples of memory systems that can make use of decoder implementations as described in the present application are found in co-pending U.S. application Ser. No. 12/537,060, titled "STORAGE DEVICES WITH SOFT PROCESSING," filed Aug. 6, 2009, which is incorporated herein by reference.

Examples described above are implemented in various ways. In one example, a particular code, for example, represented as a check matrix, is transformed using a computer implemented (optionally human assisted) technique that produces a data representation of switching and interconnect circuitry, and optionally of the circuit implementations of soft Equals and soft XOR circuits. In some examples, this data representation (e.g., data structures or instructions) is stored on a machine readable medium and is later used to impart functionality when employed in a computer-based device layout and fabrication system. In other words, when employed in such a system, the data representation is read and determines the physical circuit implementation. An example of a data representation includes a representation that follows Verilog-A or Verilog-AMS specifications. In other examples, a specific code is not specified and the resulting device is configurable to accommodate a variety of different codes. Furthermore, the approach is not limited to devices used to decode codes, as many other analog graph-based computations may be implemented using the techniques described above.

It is to be understood that the foregoing description is intended to illustrate and not to limit the scope of the invention, which is defined by the scope of the appended claims. Other embodiments are within the scope of the following claims.

What is claimed is:

1. An analog processor for error correction of a parity check code, the parity check code having a plurality of parity constraints on input values of an input frame, the processor comprising:

an intermediate value memory comprising a plurality of memory elements, each memory element being associated with a different corresponding combination of a constraint and an input value;

a plurality of analog computation modules each for performing an analog computation associated with a parity constraint of the code, each input of the computation modules being connectable to a selected plurality of the memory elements and each output of the computation modules being connectable to a selected memory element; and a controller for sequencing operation of the processor in a series of iterations, and in each iteration in a series of cycles, wherein in each cycle the controller configures connections of inputs and outputs of each analog computation module to perform a computation associated with one of the parity constraints of the parity check code, including connecting each output of each analog computation module to a memory element associated with the parity constraint and connecting each input of the analog computation module to a memory element associated with an input value used in the parity constraint, wherein in each cycle, no memory element is connected to both an input and an output of any of the analog computation modules.

2. The analog processor of claim 1 wherein each input of the computation modules is connectable to a selected plurality of the memory elements with a circuit element that combines current representations of values stored in the selected plurality of memory elements.

3. The analog processor of claim 2 wherein the circuit element that combines the current representations comprises a bus that sums the current representations.

4. The analog processor of claim 1 wherein all the inputs of each of the analog computation modules are configured to concurrently accept values from all the memory elements to which they are connected.

5. The analog processor of claim 1 wherein each memory element is configured to store an analog representation of a value.

6. The analog processor of claim 1 wherein each memory element is configured to accept a current representation of a value and to maintain a state sufficient to provide a current representation of the value.

7. The analog processor of claim 6 wherein the accepted current representation of the value and provided current representation of the value have equal current magnitude.

8. The analog processor of claim 6 wherein each memory element includes a device for sensing a current of the accepting current representation and storing a value that is in a monotonic relationship to the sensed current, said device also being for controlling a current of the provided current representation according to the stored value and the monotonic relationship.

9. The analog processor of claim 1 wherein the intermediate value memory is arranged into groups of memory elements, each group being associated with one of the parity constraints of the code, wherein in each cycle, each group of memory elements includes at most one element that is connected to any one analog computation module.

10. The analog processor of claim 9 wherein in each cycle, each output of an analog computation module performing a computation associated with a constraint is connected to a different group of memory elements associated with the constraint.

11. The analog processor of claim 9 wherein in each cycle, each input of an analog computation module performing a computation associated with a constraint is connected to a plurality of groups of memory elements not associated with the constraint.

12. The analog processor of claim 1 wherein the parity check code is representable by a code matrix having a block structure in which block are either zero of have non-zero values on only one circularly offset diagonal.

13. The analog processor of claim 12 wherein the parity check code comprises a Low Density Parity Check (LDPC) code.

14. The analog processor of claim 12 wherein the intermediate value memory is partitioned in to groups of memory elements, each group corresponding to a different non-zero block of the code matrix.

15. The analog processor of claim 14 wherein the controller is configured such that in each cycle of an iteration, memory elements of one of the groups of memory elements are connected to either inputs or outputs of the analog computation modules but not both inputs and outputs of said modules.

16. The analog processor of claim 14 wherein each of the groups of memory elements includes a plurality of sections, each section arranged to have at most one memory element connected to an analog computation module.

17. The analog processor of claim 14 wherein the each of the groups of memory elements is configured to concurrently connect a memory element to each of the analog computation modules.

18. A method for operating an analog processor for error correction of a parity check code, the parity check code having a plurality of parity constraints on input values of an input frame, the method comprising:

maintaining values in an intermediate value memory comprising a plurality of memory elements, each memory element being associated with a different corresponding combination of a constraint and an input value; and sequencing operation of the processor in a series of iterations, and in each iteration in a series of cycles, wherein in each cycle connections of inputs and outputs of each module of a plurality of analog computation modules are configured to perform a computation associated with one of the parity constraints of the parity check code, including connecting each output of the analog computation module to a memory element associated with the parity constraint and connecting each input of each analog computation module to a memory element associated with an input value used in the parity constraint, wherein in each cycle, no memory element is connected to both an input and an output of any of the analog computation modules.

19. The method of claim 18 wherein connecting each output of the analog computation module to a memory element includes connecting said module to a selected plurality of the memory elements with a circuit element that combines current representations of values stored in the selected plurality of memory elements.

20. The method of claim 18 wherein maintaining the value in the intermediate value memory comprises storing an analog representation of the value.

21. The method of claim 18 wherein the parity check code comprises a Low Density Parity Check (LDPC) code.

22. An analog processor comprising:
a first memory module for storing a first set of storage values in respective storage elements each representing a respective input to the processor;
a second memory module for storing a second set of storage values in analog form in respective storage elements, the second set of storage values including intermediate values determined during operation of the processor, the second memory module including a plurality of memory sections, groups of the sections forming banks;

a plurality of analog computation modules coupled to the first and the second memory modules, the processor being configurable such that in each of a plurality of operation cycles the analog computation modules determine values for at least some of the second set of storage values based on at least some of the first and the second sets of storage values, said analog computation modules being concurrently operable to determines values for different subsets of the second set of storage values in each operation cycle, wherein for each of the analog computation modules each input of a plurality of inputs to the analog computation module is associated with a different bank of the memory sections; and an output module for generating a set of outputs from at least some of the second set of storage values;

wherein the analog processor is configurable such that in each cycle, each memory section includes memory elements that either provide values to one or more of the analog computation modules or memory elements that are updated with values from the one or more analog computation modules.

23. The processor of claim 22 wherein the analog computation modules are configured to accept and provide analog signals that are substantially logarithmic representations of at least one of probabilities, likelihoods, and likelihood ratios.

24. The processor of claim 23 wherein the processor is configured to implement a decoder for a low density parity check (LDPC) code.

25. The processor of claim 22 wherein the one or more of the analog computation modules includes inputs for configuring one or more gain characteristics in the network of processing elements.

* * * * *

UNITED STATES PATENT AND TRADEMARK OFFICE
CERTIFICATE OF CORRECTION

PATENT NO. : 8,972,831 B2  Page 1 of 1
APPLICATION NO. : 13/521505
DATED : March 3, 2015
INVENTOR(S) : David Reynolds et al.

It is certified that error appears in the above-identified patent and that said Letters Patent is hereby corrected as shown below:

In the specification insert in Line 27 of Column 1: before "BACKGROUND"

--STATEMENT AS TO FEDERALLY SPONSORED RESEARCH

This invention was made with government support under FA8750-07C-0231 awarded by the Defense Advanced Research Projects Agency (DARPA). The government has certain rights in the invention.-- therefor.

Signed and Sealed this
Seventh Day of June, 2016

Michelle K. Lee
*Director of the United States Patent and Trademark Office*